(12) United States Patent
Lee et al.

(10) Patent No.: US 11,803,436 B2
(45) Date of Patent: Oct. 31, 2023

(54) STORAGE DEVICE AND STORAGE SYSTEM INCLUDING THE SAME

(71) Applicant: SAMSUNG ELECTRONICS CO., LTD., Suwon-si (KR)

(72) Inventors: Chul Ho Lee, Hwaseong-si (KR); Ki Jong Nam, Hwaseong-si (KR); Won-Gi Hong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 17/486,341

(22) Filed: Sep. 27, 2021

(65) Prior Publication Data

US 2022/0188177 A1     Jun. 16, 2022

(30) Foreign Application Priority Data

Dec. 15, 2020     (KR) .................. 10-2020-0175534

(51) Int. Cl.
| | | |
|---|---|---|
| *G06F 11/00* | (2006.01) | |
| *G06F 11/07* | (2006.01) | |
| *G06F 3/06* | (2006.01) | |
| *G11C 16/10* | (2006.01) | |
| *G01K 3/00* | (2006.01) | |
| *G11C 16/04* | (2006.01) | |
| *G11C 16/26* | (2006.01) | |
| *G06F 11/30* | (2006.01) | |

(52) U.S. Cl.
CPC ............ *G06F 11/076* (2013.01); *G01K 3/005* (2013.01); *G06F 3/0619* (2013.01); *G06F 3/0659* (2013.01); *G06F 3/0679* (2013.01); *G06F 11/0727* (2013.01); *G06F 11/3058* (2013.01); *G11C 16/0483* (2013.01); *G11C 16/10* (2013.01); *G11C 16/26* (2013.01)

(58) Field of Classification Search
CPC . G06F 11/076; G06F 11/0727; G06F 11/3058
See application file for complete search history.

(56) References Cited

U.S. PATENT DOCUMENTS

| | | |
|---|---|---|
| 6,240,032 B1 | 5/2001 | Fukumoto |
| 8,843,700 B1 | 9/2014 | Salessi et al. |
| 9,280,419 B2 | 3/2016 | Chunn et al. |
| 9,529,541 B2 | 12/2016 | Cho et al. |
| 9,543,025 B2 | 1/2017 | Fitzpatrick et al. |

(Continued)

FOREIGN PATENT DOCUMENTS

JP     2019204229 A     11/2019

*Primary Examiner* — Philip Guyton
(74) *Attorney, Agent, or Firm* — Sughrue Mion, PLLC

(57) ABSTRACT

A storage device and a storage system including the same are provided. The storage device includes a nonvolatile memory with a valid page and a free page; a temperature sensor configured to sense a temperature of the nonvolatile memory; and a storage controller configured to implement: a patrol read module configured to read valid data stored in the valid page and identify a number of errors in the read valid data according to a set time period, and a retention module configured to, based on the temperature or the number of errors, read the valid data stored in the valid page, and write the valid data to the free page while controlling a threshold voltage distribution width corresponding to a value of the valid data written to the free page.

19 Claims, 20 Drawing Sheets

(56) References Cited

U.S. PATENT DOCUMENTS

| | | |
|---|---|---|
| 10,732,890 B2 | 8/2020 | Kaynak et al. |
| 2015/0092488 A1 | 4/2015 | Wakchaure et al. |
| 2016/0098216 A1* | 4/2016 | Huang .................. G06F 11/073 |
| | | 714/37 |
| 2022/0188177 A1* | 6/2022 | Lee ....................... G06F 11/076 |

* cited by examiner

STORAGE DEVICE AND STORAGE SYSTEM INCLUDING THE SAME

CROSS-REFERENCE TO RELATED APPLICATION

This application claims priority from Korean Patent Application No. 10-2020-0175534, filed on Dec. 15, 2020 in the Korean Intellectual Property Office, the disclosure of which is incorporated herein by reference in its entirety.

BACKGROUND

1. Technical Field

Methods, apparatuses and systems consistent with example embodiments to a storage device.

2. Description of Related Art

A flash memory is a nonvolatile memory that can retain stored data even when power supply is interrupted. Recently, a storage device including a flash memory, such as a solid state drive (SSD) and a memory, card has been widely used. The flash memory stores data by changing threshold voltages of memory cells, and reads data using a predetermined read level. However, due to deterioration of the memory cells, the threshold voltages of the memory cells may change over time, and accordingly, a read error may occur.

SUMMARY

One or more example embodiments provide a storage device with improved retention performance.

One or more example embodiments provide a storage system with improved retention performance.

According to an aspect of an example embodiment, a storage device includes: a nonvolatile memory with a valid page and a free page; a temperature sensor configured to sense a temperature of the nonvolatile memory; and a storage controller configured to implement: a patrol read module configured to read valid data stored in the valid page and identify a number of errors in the read valid data according to a set time period, and a retention module configured to, based on the temperature or the number of errors, read the valid data stored in the valid page, and write the valid data to the free page while controlling a threshold voltage distribution width corresponding to a value of the valid data written to the free page.

According to an aspect of an example embodiment, a storage system includes: an aspect of an example embodiment, a storage system includes: a host controller configured to receive a retention level and a retention mode activation command, and generate a retention mode command indicating the retention level in response to the retention mode activation command; and a storage controller with a nonvolatile memory device that has a valid page and a free page, wherein the storage controller is configured to implement a retention module configured to, in response to the retention mode command, read valid data stored in the valid page, and write the valid data to the free page according to the retention level while controlling a threshold voltage distribution width corresponding to a value of the valid data written to the free page.

According to an aspect of an example embodiment, a storage system includes: a storage device; a controller configured to monitor a power-off period during which the storage device maintains a power-off state, and provide a retention mode command to the storage device based on the power-off period being greater than or equal to a set power-off period; and a power supply device configured to supply power to the storage device and the controller. The storage device includes: a nonvolatile memory comprising a valid page and a free page; and a storage controller configured to, in response to the retention mode command, read valid data stored in the valid page, and write the valid data to the free page.

Aspects of the present disclosure are not restricted to those set forth herein. The above and other aspects of the present disclosure will become more apparent to one of ordinary skill in the art by referencing the description below.

BRIEF DESCRIPTION OF THE DRAWINGS

The above and other aspects will be more apparent from the following description of example embodiments taken in conjunction with the attached drawings, in which.

DETAILED DESCRIPTION

Figure 1:
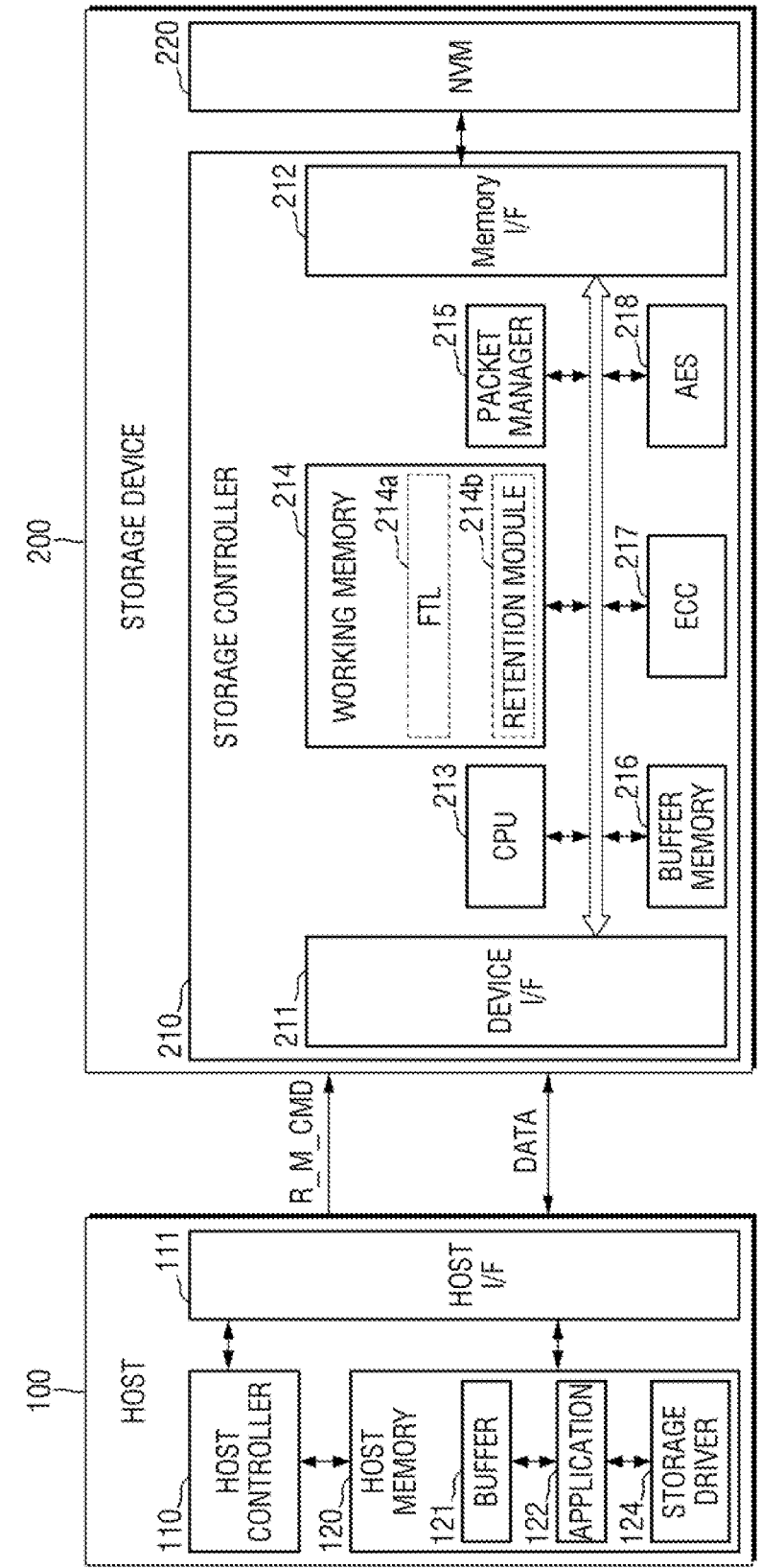
FIG. 1 is a block diagram illustrating a storage system according to example embodiments.

FIG. 1 is a block diagram illustrating a storage system according to example embodiments.

Referring to FIG. 1, a storage system 1 according to example embodiments may include a host 100 and a storage device 200.

The storage device 200 may include storage media for storing data according to a request from the host 100. As one example, the storage device 200 may include any one or any combination of a solid state drive (SSD), an embedded memory, or a removable external memory. When the SSD is provided in the storage device 200, the storage device 200 may be a device conforming to a standard such as nonvolatile memory express (NVMe), SATA, or SAS. When the embedded memory or the external memory is provided in the storage device 200, the storage device 200 may be a device conforming to a standard such as universal flash storage (UFS), embedded multi-media card (eMMC), security digital (SD), or other protocol. The host 100 and the storage device 200 may each generate and transmit a packet according to an adopted standard protocol.

When a nonvolatile memory 220 of the storage device 200 includes a flash memory, the flash memory may include a 2D NAND memory array or a 3D (or vertical) NAND (VNAND) memory array. As another example, the storage device 200 may include various other types of nonvolatile memories. For example, a magnetic RAM (MRAM), a spin-transfer torque MRAM, a conductive bridging RAM (CBRAM), a ferroelectric RAM (FeRAM), a phase RAM (PRAM), a resistive memory (resistive RAM), or various other types of memories may be applied to the storage device 200.

According to example embodiments, the host 100 may include host controller 110, host memory 120, and host interface 111.

According to an example embodiment, the host controller 110 and the host memory 120 may be implemented as separate semiconductor chips. Alternatively, in example embodiments, the host controller 110 and the host memory 120 may be integrated in the same semiconductor chip. As one example, the host controller 110 may be any one of a plurality of modules provided in an application processor, and the application processor may be implemented as a system on chip (SoC). In addition, the host memory 120 may be an embedded memory provided in the application processor, or a nonvolatile memory or a memory module disposed outside the application processor.

The host controller 110 may have an operating system (OS) installed, and may control the overall operation of the host 100 by the operating system (OS). The operating system (OS) may be, for example, any one of Windows series, Unix series, Linux series, and the like. The host controller 110 may manage an operation of storing data (e.g., write data) of a buffer area 121 into the nonvolatile memory 220 or storing data (e.g., read data) of the nonvolatile memory 220 into the buffer area 121.

The host interface 111 may provide a physical connection between the host 100 and the storage device 200. The host interface 21 may be implemented with various types of interfaces, such as advanced technology attachment (ATA), serial ATA (SATA), external SATA (e-SATA), small computer small interface (SCSI), serial attached SCSI (SAS), peripheral component interconnection (PCI), PCI express (PCIe), IEEE 1394, universal serial bus (USB), secure digital (SD) card, multi-media card (MMC), embedded multi-media card (eMMC), and compact flash (CF) card.

The host memory 120 may be used as a buffer memory, a working memory, or the like for temporarily storing data to be transmitted to the storage device 200 or data transmitted from the storage device 200. For example, the host memory 120 may be implemented as a volatile memory such as DRAM or SRAM, or a nonvolatile memory such as PRAM or flash memory.

An application 122 and a storage driver 124 may be implemented in firmware or software, and may be loaded into the host memory 120. Alternatively, the application 122 and/or the storage driver 124 may be implemented in hardware.

The application 122 may correspond to various types of applications installed on the host 100 and capable of accessing the storage device 200. The application 122 may be an application that provides a retention mode activation request to the storage device 200 so that the storage device 200 performs a retention operation. The application 122 may provide the retention mode activation request including a retention level to the storage device 200. For example, the application 122 may receive an input from a user and provide the retention mode activation request including a retention level to the storage device 200. The retention level may be set by the user.

The storage driver 124 may access the storage device 200 at the request of the operating system or the application 122. The storage driver 124 may convert the request of the application 122 into a command corresponding to the storage device 200 to access the storage device 200.

The storage driver 124 may provide a retention mode command R_M_CMD including the retention level to the storage device 200 at the retention mode activation request provided from the application 122. The retention mode command R_M_CMD may be a command conforming to the host interface 111 and a device interface 211. The retention mode command R_M_CMD may be, for example, one of input/output commands such as a read command and a write command. The retention mode command R_M_CMD may be, for another example, one of vendor specific commands through which a manufacturer can define an operation. The retention mode command R_M_CMD according to example embodiments may be a vendor command which defines the retention operation based on the retention level.

The storage device 200 may include a storage controller 210 and the nonvolatile memory 220.

The storage controller 210 may include the device interface 211, a memory interface 212, and a central processing unit (CPU) 213. In addition, the storage controller 210 may further include the working memory 214, a packet manager 215, a buffer memory 216, an error correction code (ECC) engine 217, and an advanced encryption standard (AES) engine 218.

The device interface 211 may transmit and receive a packet to and from the host 100. A packet transmitted from the host 100 to the device interface 211 may include a command, data to be written to the nonvolatile memory 220, and the like. A packet transmitted from the device interface 211 to the host 100 may include a response to the command, data read from the nonvolatile memory 220, and the like. The memory interface 212 may transmit data to be written to the nonvolatile memory 220 to the nonvolatile memory 220 or may receive data read from the nonvolatile memory 220. The memory interface 212 may be implemented to conform to standard conventions such as Toggle or ONFI.

The working memory 214 may operate under the control of the CPU 213 and may be used as a working memory, a buffer memory, a cache memory, or the like. For example, the working memory 214 may be implemented as a volatile memory such as DRAM or SRAM, or a nonvolatile memory such as PRAM or flash memory.

A flash transition layer (FTL) 214a may be loaded into the working memory 214. Data write and read operations for the nonvolatile memory 220 may be controlled by the CPU 213 executing the flash transition layer 214a. The flash transition layer 214a may perform various functions such as address mapping, wear-leveling, and garbage collection. The address mapping operation is an operation of converting a logical address received from the host into a physical address used to actually store data in the nonvolatile memory 220. The wear-leveling function is a technique for preventing excessive deterioration of a specific block by allowing blocks in the nonvolatile memory 220 to be uniformly used. For example, the wear-leveling may be implemented through firmware technology that balances erase counts of physical blocks. The garbage collection function is a technique for securing usable capacity in the nonvolatile memory 220 by copying valid data of a block to a new block and erasing the existing block.

A retention module 214b may be implemented in firmware or software, and may be loaded into the working memory 214. Alternatively, the retention module 214b may be implemented in hardware. The retention module 214b may perform the retention operation in response to the retention mode command R_M_CMD. The retention module 214b may perform the retention operation based on the retention level included in the retention mode command R_M_CMD. Accordingly, the retention module 214b may control the width of the threshold voltage distribution corresponding to data.

That is, in the storage system according to example embodiments, the retention operation may be performed by the user's request. The user may request the retention operation. For example, the retention operation may be requested based on the retention level or according to a situation of the storage system, such as a situation in which the storage system is left unattended for a long time.

The packet manager 215 may generate a packet according to a protocol of an interface negotiated with the host 100 or may parse various types of information from a packet received from the host 100. In addition, the buffer memory 216 may temporarily store data to be written to the nonvolatile memory 220 or data read from the nonvolatile memory 220. The buffer memory 216 may be provided inside the storage controller 210, or alternatively, may be provided outside the storage controller 210.

The ECC engine 217 may perform an error detection and correction function for read data read from the nonvolatile memory 220. More specifically, the ECC engine 217 may generate parity bits for write data to be written to the nonvolatile memory 220, and the generated parity bits may be stored in the nonvolatile memory 220 together with the write data. When data is read from the nonvolatile memory 220, the ECC engine 217 may correct an error in the read data using parity bits read from the nonvolatile memory 220 together with the read data, and may output the read data in which the error has been corrected.

The AES engine 218 may perform, using a symmetric-key algorithm, any one or any combination of an encryption operation or a decryption operation for data inputted to the storage controller 210.

Figure 2:
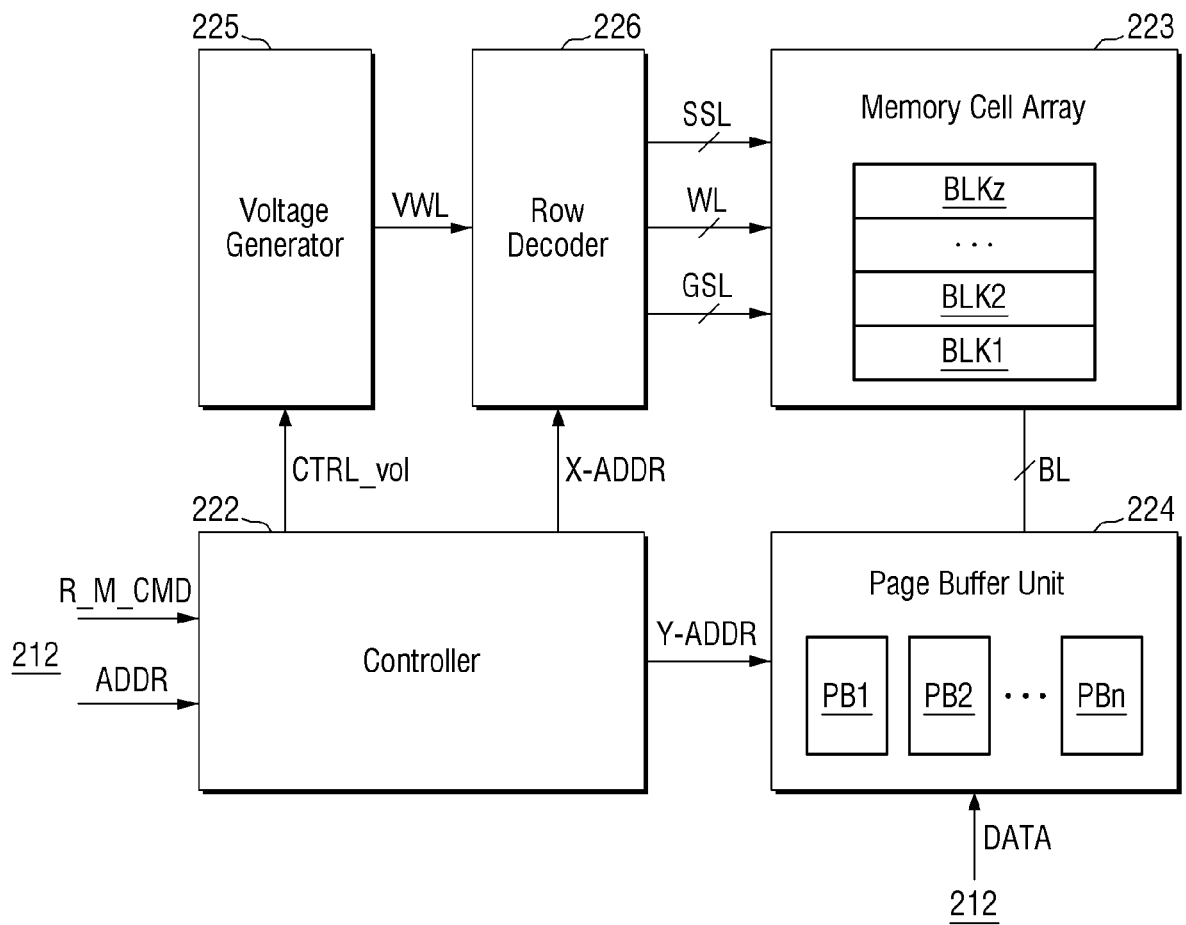
FIG. 2 is a block diagram illustrating a nonvolatile memory according to example embodiments of FIG. 1.

FIG. 2 is an exemplary block diagram illustrating a nonvolatile memory according to example embodiments.

Referring to FIG. 2, the nonvolatile memory 220 may include a controller 222, a memory cell array 223, a page buffer unit 224, a voltage generator 225, and a row decoder 226. The nonvolatile memory 220 may further include the memory interface 212 shown in FIG. 1, and may further include a column logic, a pre-decoder, a temperature sensor, a command decoder, an address decoder, and the like.

The controller 222 may control various operations of the nonvolatile memory 220. The controller 222 may output various control signals in response to a command CMD and/or an address ADDR from the memory interface 212. For example, the controller 222 may output a voltage control signal CTRL_vol, a row address X-ADDR, and a column address Y-ADDR.

The memory cell array 223 may include a plurality of memory blocks BLK1 to BLKz (z is a positive integer), and each of the plurality of memory blocks BLK1 to BLKz may include a plurality of memory cells. The memory cell array 223 may be connected to the page buffer unit 224 through bit lines BL, and may be connected to the row decoder 226 through word lines WL, string select lines SSL, and ground select lines GSL.

In an example embodiment, the memory cell array 223 may include a 3D memory cell array, and the 3D memory cell array may include a plurality of NAND strings. Each NAND string may include memory cells respectively connected to word lines vertically stacked on a substrate. U.S. Pat. Nos. 7,679,133, 8,553,466, 8,654,587, 8,559,235, and U.S. Patent Application Publication No. 2011/0233648 are incorporated herein by reference. In an example embodiment, the memory cell array 223 may include a 2D memory cell array, and the 2D memory cell array may include a plurality of NAND strings arranged along row and column directions.

The page buffer unit 224 may include a plurality of page buffers PB1 to PBn (where n is an integer equal to or greater than 3), and the plurality of page buffers PB1 to PBn may be connected respectively to the memory cells through the plurality of bit lines BL. The page buffer unit 224 may select at least one of the bit lines BL based on the column address Y-ADDR. The page buffer unit 224 may operate as a write driver or a sense amplifier depending on an operation mode. For example, during a program operation, the page buffer unit 224 may apply, to the selected bit line, a bit line voltage corresponding to data to be programmed. During a read operation, the page buffer unit 224 may sense data stored in the memory cell by sensing a current or voltage of the selected bit line.

The voltage generator 225 may generate various types of voltages for performing program, read, and erase operations based on the voltage control signal CTRL_vol. For example, the voltage generator 225 may generate a program voltage, a read voltage, a program verification voltage, an erase voltage, and the like as a word line voltage VWL.

The row decoder 226 may select one of the plurality of word lines WL and one of the plurality of string select lines SSL, based on the row address X-ADDR. For example, during a program operation, the row decoder 226 may apply a program voltage and a program verification voltage to the selected word line, and during a read operation, the row decoder 226 may apply a read voltage to the selected word line.

Figure 3:
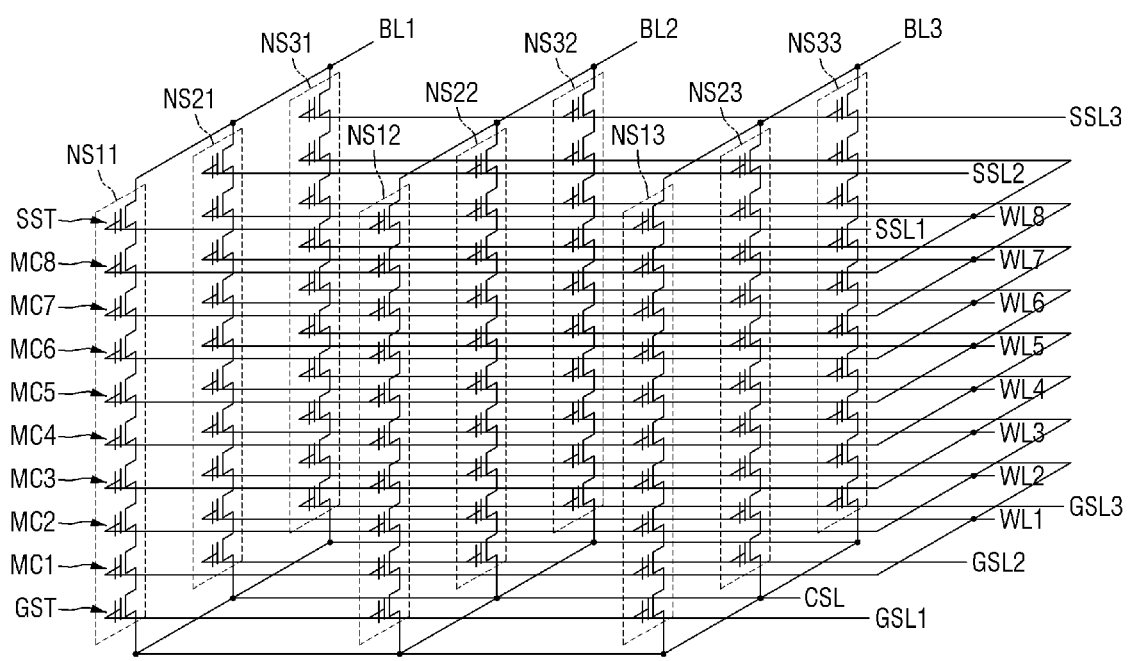
FIG. 3 is a diagram of a 3D V-NAND structure according to example embodiments.

FIG. 3 is a diagram illustrating a 3D V-NAND structure according to example embodiments. When the nonvolatile memory 220 of FIG. 1 is implemented as a 3D V-NAND type flash memory, a plurality of memory blocks BLK1 to BLKz constituting the memory cell array 223 (see FIG. 2) of the nonvolatile memory 220 may each be represented by an equivalent circuit as shown in FIG. 3.

The memory block BLK1 shown in FIG. 3 represents a 3D memory block formed in a 3D structure on the substrate. For example, a plurality of memory NAND strings included in the memory block BLK1 may be formed in a direction perpendicular to the substrate.

Referring to FIG. 3, the memory block BLK1 may include a plurality of memory NAND strings NS11 to NS33 connected between a common source line CSL and bit lines BL1, BL2, and BL3. The plurality of memory NAND strings NS11 to NS33 may each include a string select transistor SST, a plurality of memory cells MC1 to MC8, and a ground select transistor GST. In FIG. 3, it is illustrated that each of the plurality of memory NAND strings NS11 to NS33 includes eight memory cells MC1 to MC8, but the present disclosure is not necessarily limited thereto.

The string select transistor SST may be connected to a string select line SSL1, SSL2, SSL3 corresponding thereto. The plurality of memory cells MC1 to MC8 may be connected to corresponding gate lines GTL1 to GTL8, respectively. The gate lines GTL1 to GTL8 may correspond to the word lines, and some of the gate lines GTL1 to GTL8 may correspond to dummy word lines. The ground select transistor GST may be connected to a ground select line GSL1, GSL2, GSL3 corresponding thereto. The string select transistor SST may be connected to the bit line BL1, BL2, BL3 corresponding thereto, and the ground select transistor GST may be connected to the common source line CSL.

The word line (e.g., WL1) at the same height may be connected in common, and the ground select lines GSL1, GSL2, and GSL3 and the string select lines SSL1, SSL2, and SSL3 may be separated from each other. In FIG. 3, the memory block BLK1 is shown to be connected to eight gate lines GTL1 to GTL8 and three bit lines BL1, BL2, BL3, but is not necessarily limited thereto.

Figure 4:
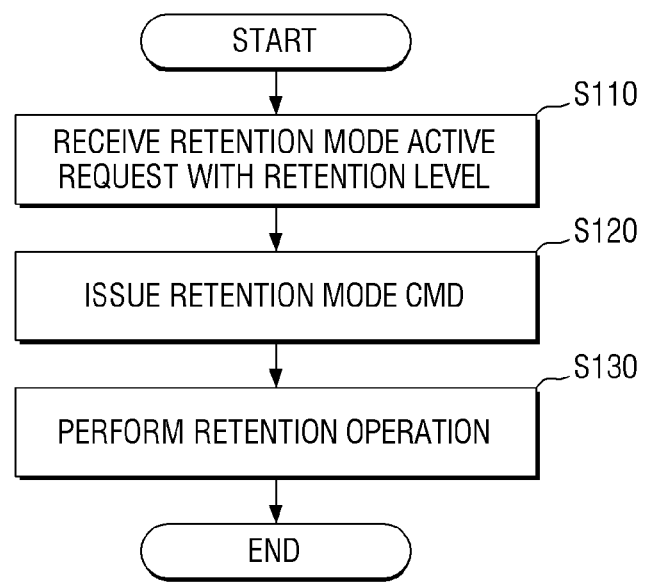
FIG. 4 is a flowchart illustrating operation of a storage system according to example embodiments.

FIG. 4 is a flowchart illustrating operation of a storage system according to example embodiments.

Referring to FIGS. 1 and 4, the storage driver 124 may receive the retention mode activation request including a retention level (operation S110). The retention mode activation request including a retention level may be provided from the application 122. The retention level may be a period in which data stored in the nonvolatile memory 220 is guaranteed. For example, a first retention level may indicate a first period, and a second retention level may indicate a second period longer than the first period. The period in which data is guaranteed may vary depending on the width of the threshold voltage distribution of valid data. In other words, the width of the threshold voltage distribution of valid data may vary depending on the retention level.

The storage driver 124 may issue the retention mode command R_M_CMD including the retention level in response to the retention mode activation request (operation S120). The storage driver 124 may provide the retention mode command R_M_CMD to the storage device 200.

The storage device 200 may perform the retention operation in response to the retention mode command R_M_CMD (operation S130). The retention operation may be performed based on the retention level.

Figure 5:
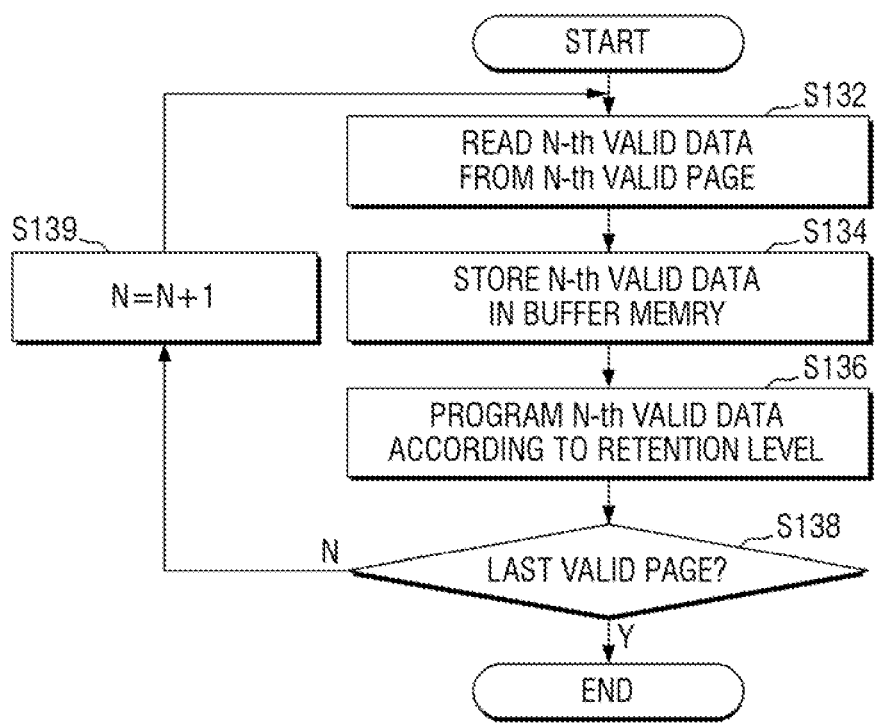
FIG. 5 is a flowchart illustrating operation of a storage system according to example embodiments.

FIG. 5 is a flowchart illustrating a retention operation according to example embodiments. For example, the retention operation S130 of FIG. 4 may include the operations shown in FIG. 5.

Referring to FIGS. 1 and 5, the nonvolatile memory 220 may include at least one valid page and at least one free page. The retention module 214b may perform the retention operation in response to the retention mode command R_M_CMD.

The retention module 214b may read valid data from the valid page of the nonvolatile memory 220 (operation S132).

The retention module 214b may store the valid data read from the valid page of the nonvolatile memory 220 in the buffer memory 216 (operation S134).

The retention module 214b may program the valid data in the free page of the nonvolatile memory 220 based on the retention level included in the retention mode command R_M_CMD (operation S136). For example, the valid data read from the valid page of a first memory block may be written to the free page of a free block different from the first memory block.

When the number of the free pages is smaller than the number of the valid pages in the nonvolatile memory 220, the retention module 214b may generate a free block by performing an erase operation on at least one memory block, and may program the valid data into the free page. Accordingly, invalid pages may be erased, resulting in a garbage collection effect.

In the nonvolatile memory 220, as the program time increases, the width of the threshold voltage distribution may decrease and the retention performance may be improved. Accordingly, the retention module 214b may control the width of the threshold voltage distribution by, for example, controlling the program time based on the retention level, thereby improving the retention performance.

The retention module 214b may determine whether the valid page in operation S132 is the last valid page (operation S138). If the valid page in operation S132 is the last valid page, the retention operation may be terminated. On the other hand, if the valid page in operation S132 is not the last valid page, the retention module 214b may perform operation S132 on the next valid page (operation S139).

Figure 6:
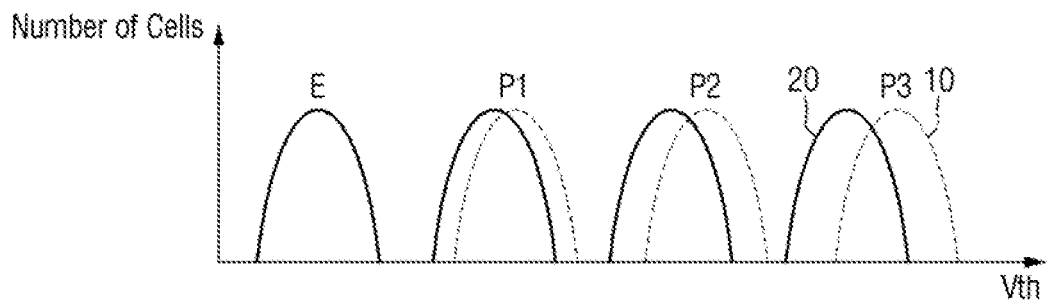
FIGS. 6 to 8 are diagrams illustrating a retention operation according to example embodiments.
Figure 7:
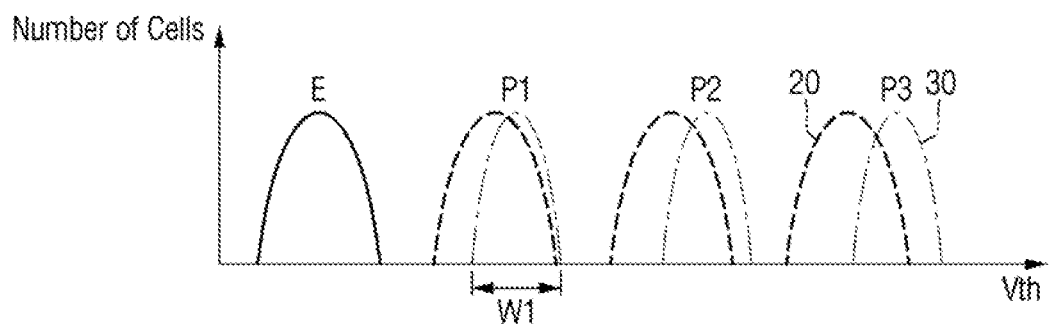
Figure 8:
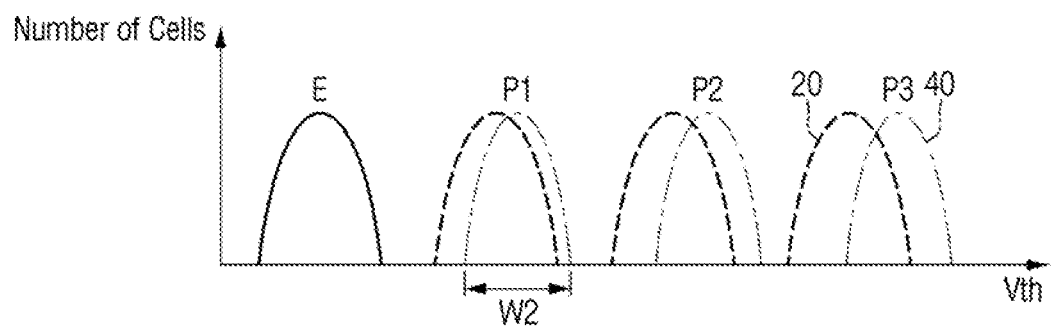

FIGS. 6 to 8 are diagrams illustrating a retention operation according to example embodiments. FIG. 6 is a diagram illustrating threshold voltage distribution of memory cells before a retention operation is performed. FIG. 7 is a diagram illustrating threshold voltage distribution of memory cells in which a retention operation has been performed based on a second retention level. FIG. 8 is a diagram illustrating threshold voltage distribution of memory cells in which a retention operation has been performed based on a first retention level. In FIGS. 6 to 8, a horizontal axis represents the threshold voltage of memory cells, and a vertical axis represents the number of memory cells.

Referring to FIG. 6, the memory cells included in the nonvolatile memory 220 (see FIG. 1) may be multi-level cells (MLC) that store 2 bits. However, example embodiments are not limited thereto, and the memory cells may be triple-level cells (TLC) or single-level cells (SLC). In FIG. 6, a dotted line 10 represents an initial program threshold voltage distribution of the memory cells, and a solid line 20 represents a threshold voltage distribution that has changed over time.

The memory cells may have four states E, P1, P2, and P3. The four states may each be defined as a range of a threshold voltage Vth. According to two bits written to each memory cell, each memory cell may be programmed to have the threshold voltage Vth belonging to one of the four states E, P1, P2, and P3. The four states E, P1, P2, and P3 may be identified using, for example, three read voltages having levels between four threshold voltage Vth ranges.

As time passes after the memory cells are programmed, the threshold voltage distribution of the memory cells may be changed due to physical characteristics of the memory cells or external factors. In particular, as time passes after the memory cells are programmed, a charge loss in which electrons trapped in a floating gate or tunnel oxide are emitted may occur, resulting in a change in the threshold voltage distribution. In addition, while repeating operations such as programming and erasing for the memory cells, the tunnel oxide may be deteriorated, so that the charge loss may further increase. The charge loss may reduce the threshold voltage. Accordingly, the threshold voltage distribution 20 may be shifted to the left compared to the initial program threshold voltage distribution 10.

Referring to FIGS. 7 and 8, threshold voltage distributions 30 and 40 of the memory cells in which the retention operation has been performed may be shifted to the right compared to the threshold voltage distribution 20 of the memory cells before the retention operation is performed.

The width of the threshold voltage distributions 30 and 40 of memory cells in which the retention operation has been performed may be smaller than the width of the threshold voltage distribution 20 of the memory cells before the retention operation is performed. Specifically, when the retention operation is performed based on the first retention level, as shown in FIG. 8, the width of the threshold voltage distribution of the memory cells may be controlled to a second width W2. In addition, when the retention operation is performed based on the second retention level, as shown in FIG. 7, the width of the threshold voltage distribution of the memory cells may be controlled to a first width W1.

The retention level may indicate a period in which the user wants the reliability of data stored in the nonvolatile memory to be guaranteed. The first retention level may be a first period, and the second retention level may be a second period longer than the first period. The second width W2 of the threshold voltage distribution 40 of the memory cells in which the retention operation has been performed based on the first retention level may be greater than the first width W1 of the threshold voltage distribution 30 of the memory cells in which the retention operation has been performed based on the second retention level. Accordingly, the valid data may be guaranteed for a longer period in the memory cells in which the retention operation has been performed based on the second retention level than in the memory cells in which the retention operation has been performed based on the first retention level.

That is, as the retention level increases, the width of the threshold voltage distribution of the memory cells in which the retention operation has been performed based on the retention level may decrease. As the retention level increases, the threshold voltage distribution of the memory cells in which the retention operation has been performed based on the retention level may become sharper.

Figure 9:
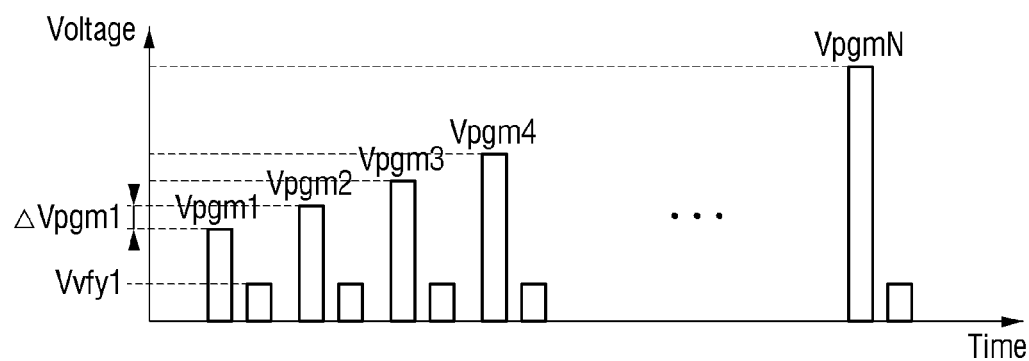
FIGS. 9 and 10 are diagrams illustrating operation of a storage system according to example embodiments.
Figure 10:
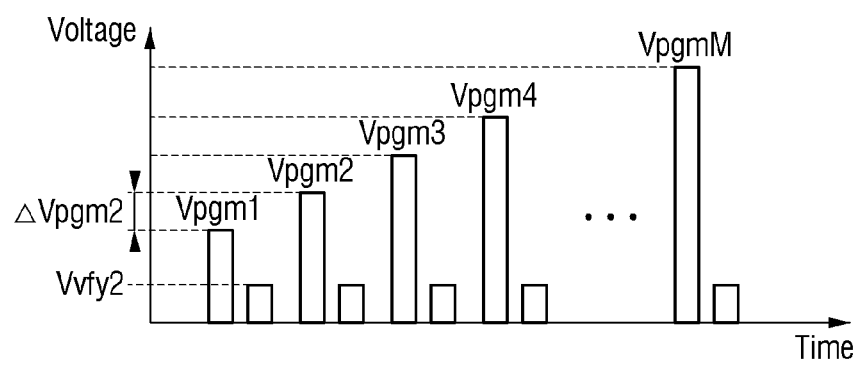

FIGS. 9 and 10 are diagrams illustrating operation S136 of FIG. 5. FIG. 9 is a diagram illustrating a method of programming valid data in a free page based on a second retention level. FIG. 10 is a diagram illustrating a method of programming valid data in a free page based on a first retention level. In FIGS. 9 and 10, a horizontal axis represents time, and a vertical axis represents a program voltage used during the retention operation.

Referring to FIGS. 1, 9, and 10, the retention module 214b may program valid data in a free page using, for example, the program voltage whose voltage level is changed in a stepwise manner based on the retention level. For example, the program voltage may be an incremental step pulse programming (ISPP) voltage whose voltage level increases in a stepwise manner.

Referring to FIGS. 1 and 9, the retention module 214b may program valid data in a free page using a plurality of first program voltages Vpgm1 to VpgmN. Each increment of the voltage level of the first program voltage Vpgm1 to VpgmN may be changed by a first voltage level ΔVpgm1. The retention module 214b may apply each of the first program voltages Vpgm1 to VpgmN and a verification voltage Vvfy1.

Referring to FIGS. 1 and 10, the retention module 214b may program valid data in a free page using a plurality of second program voltages Vpgm1 to VpgmM. Each increment of the voltage level of the second program voltage Vpgm1 to VpgmM may be changed by a second voltage level ΔVpgm2 The retention module 214b may apply each of the second program voltages Vpgm1 to VpgmM and the verification voltage Vvfy2.

The first retention level may be a first period, and the second retention level may be a second period longer than the first period. For example, the second voltage level ΔVpgm2 may be greater than the first voltage level ΔVpgm1, and the number of the second program voltages Vpgm1 to VpgmM may be same as the number of the first program voltages Vpgm1 to VpgmN. M may be same as N. For example, the second voltage level ΔVpgm2 may be same as the first voltage level ΔVpgm1, and the number of the second program voltages Vpgm1 to VpgmM may be smaller than the number of the first program voltages Vpgm1 to VpgmN. M may be smaller than N.

Accordingly, memory cells in which the retention operation has been performed based on the first retention level may have, for example, the threshold voltage distribution 40 of FIG. 8, and the memory cells in which the retention operation has been performed based on the second retention level may have, for example, the threshold voltage distribution 30 of FIG. 7. That is, the first width W1 (see FIG. 7) of the threshold voltage distribution of the memory cells in which the retention operation has been performed based on the second retention level may be smaller than the second width W2 (see FIG. 8) of the threshold voltage distribution of the memory cells in which the retention operation has been performed based on the first retention level. Accordingly, the retention performance of the memory cells in which the retention operation has been performed based on the second retention level may be higher than that of the memory cells in which the retention operation has been performed based on the first retention level.

Figure 11:
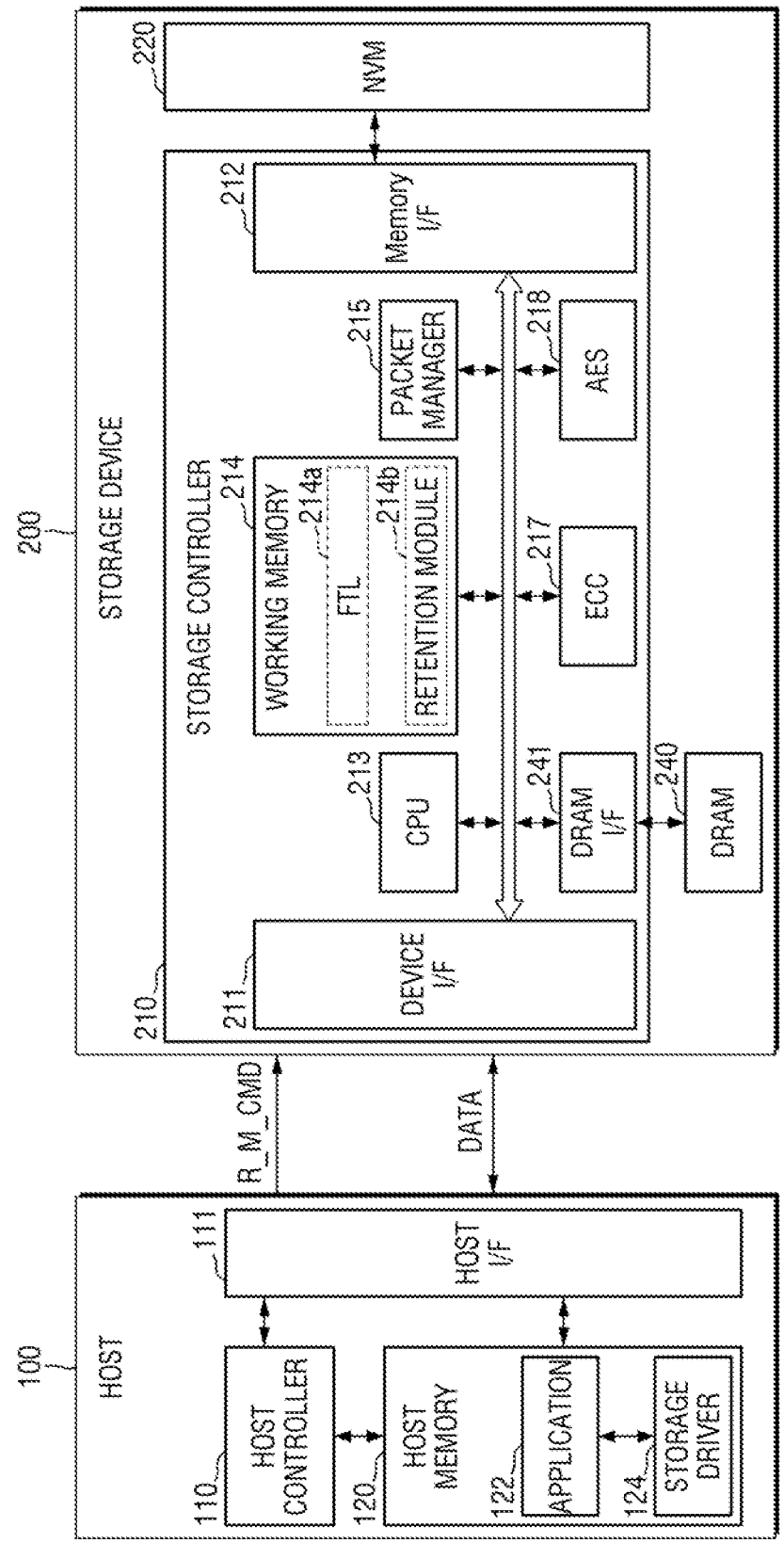
FIG. 11 is a block diagram illustrating a storage system according to example embodiments.

FIG. 11 is a block diagram illustrating a storage system according to example embodiments. For simplicity of description, differences from FIG. 1 will be mainly described.

Referring to FIG. 11, in a storage system 2 according to example embodiments, the storage controller 210 may further include a DRAM interface 241. The storage controller 210 may exchange data with a DRAM 240 through the DRAM interface 241.

The retention module 214b may perform the retention operation in response to the retention mode command R_M_CMD. Specifically, the retention module 214b may read valid data from the valid page of the nonvolatile memory 220. The retention module 214b may store the valid data read from the valid page of the nonvolatile memory 220 in the DRAM 240. The retention module 214b may program the valid data stored in the DRAM 240 into the free page of the nonvolatile memory 220 based on the retention level included in the retention mode command R_M_CMD. Accordingly, the retention module 214b may control the width of the threshold voltage distribution corresponding to an effective data value.

Figure 12:
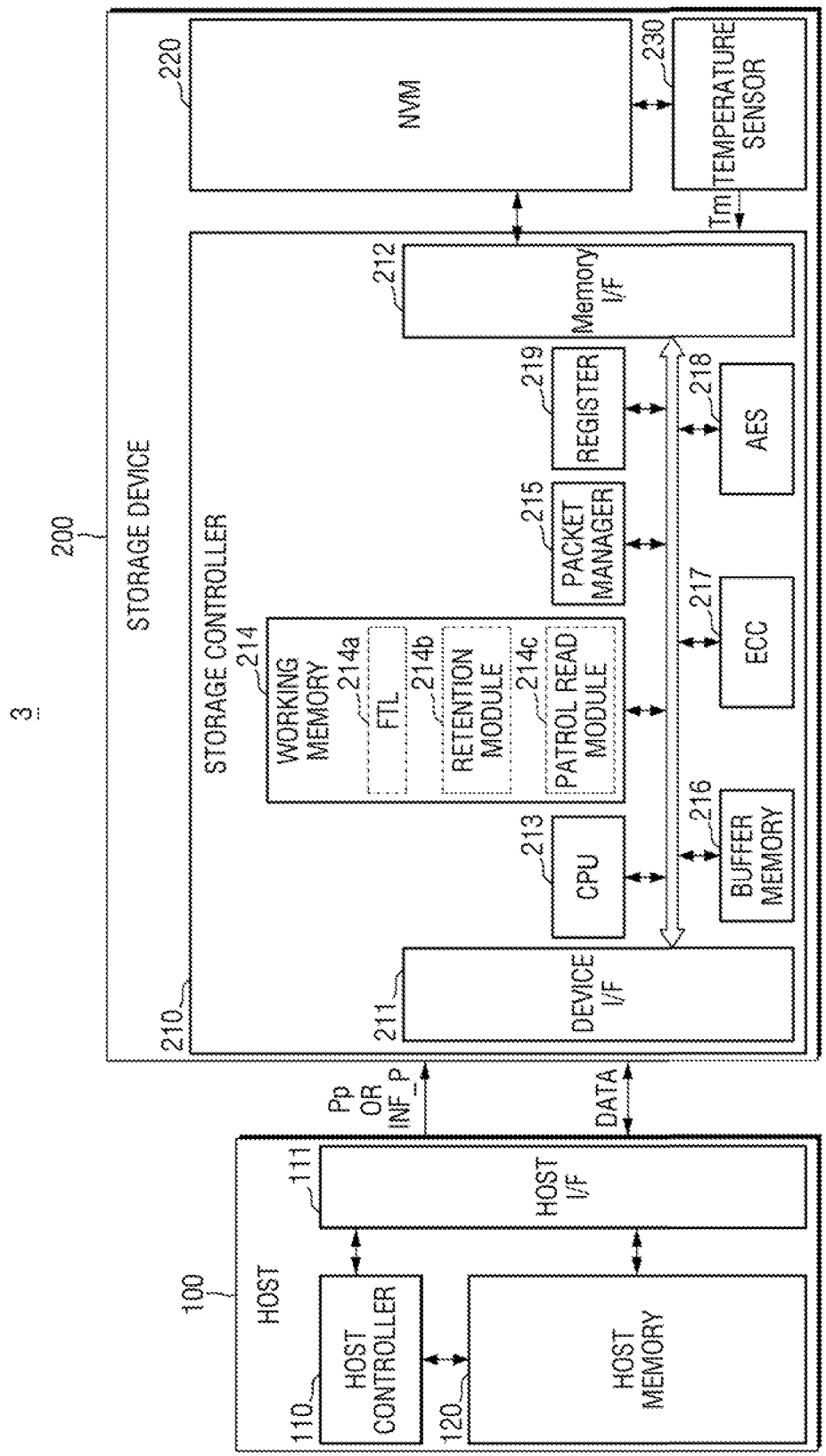
FIG. 12 is a block diagram illustrating a storage system according to example embodiments.
Figure 13:
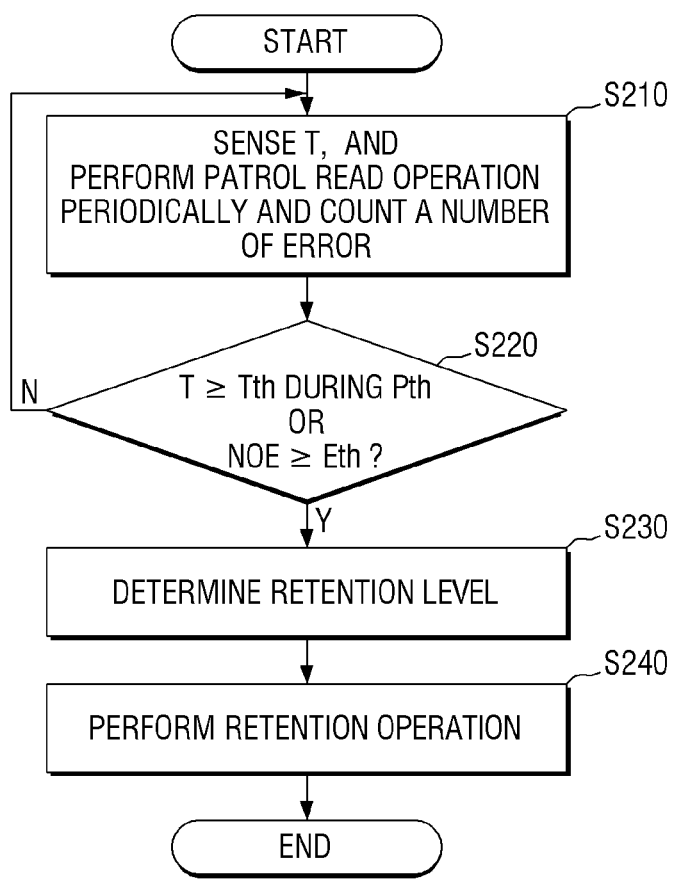
FIGS. 13, 15, and 17 are flowcharts illustrating operation of a storage system according to example embodiments.
Figure 14:
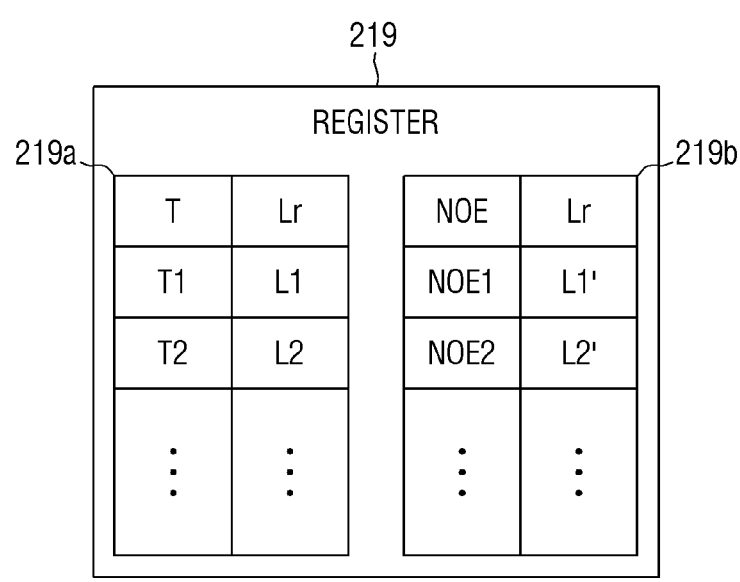
FIGS. 14 and 16 are block diagrams illustrating a register according to example embodiments.
Figure 15:
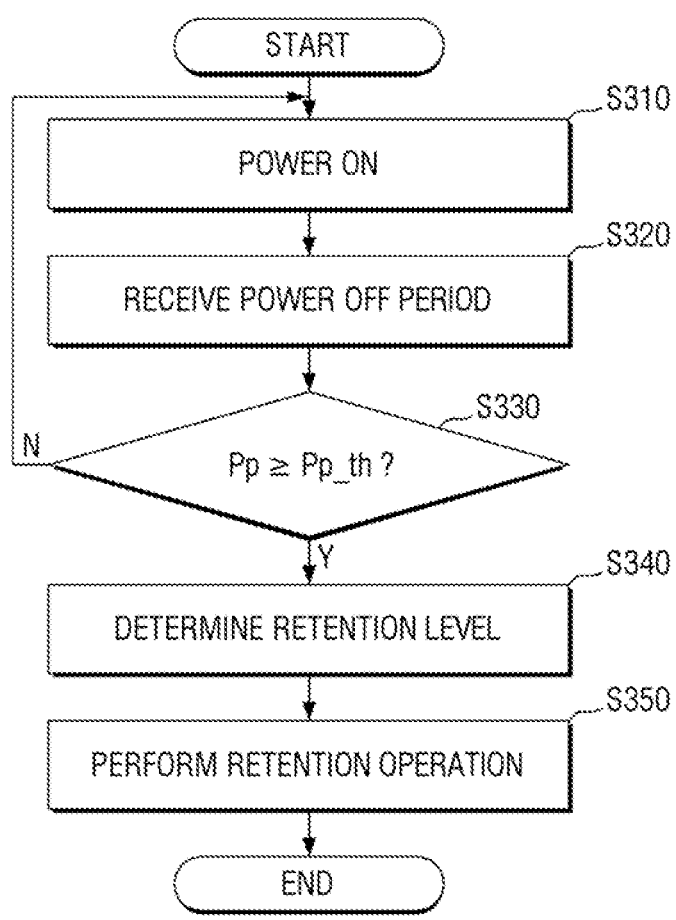
Figure 16:
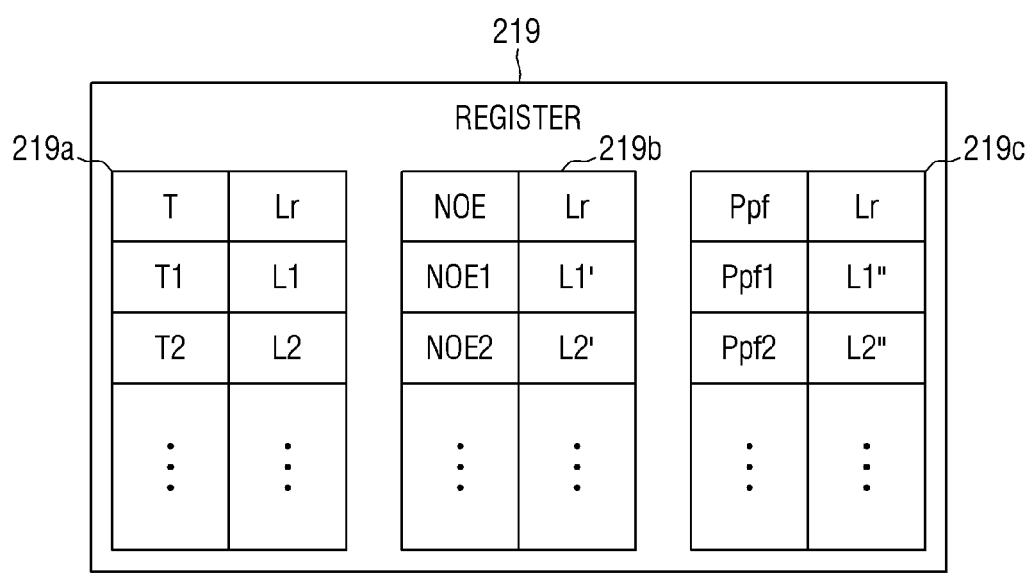
Figure 17:
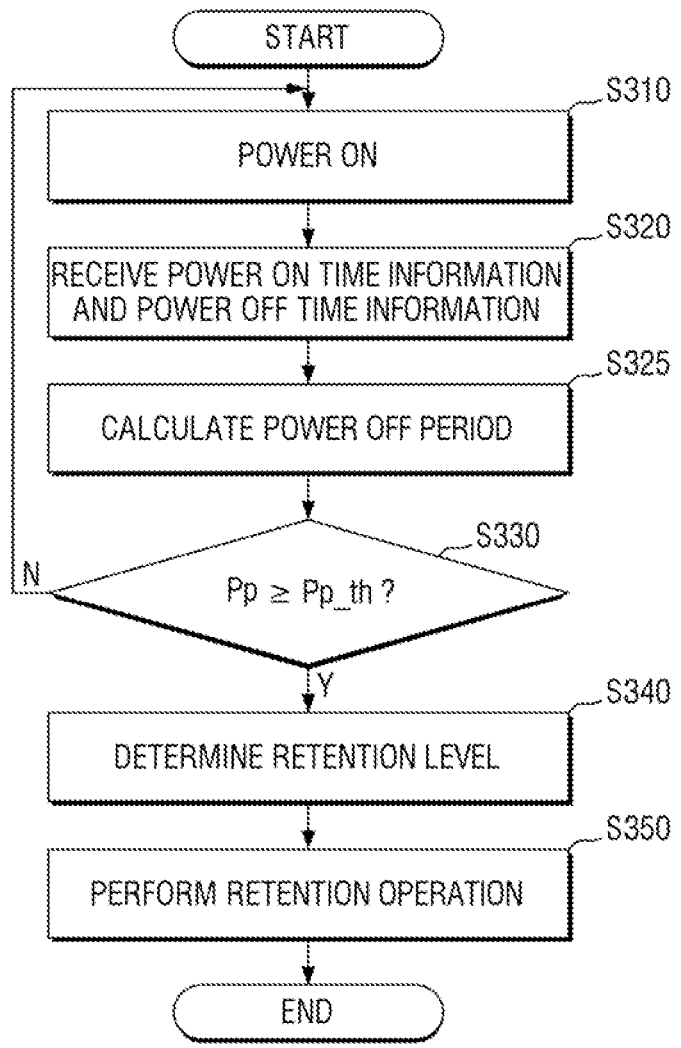

FIG. 12 is a block diagram illustrating a storage system according to example embodiments. For simplicity of description, differences from FIG. 1 will be mainly described. FIGS. 13, 15, and 17 are flowcharts illustrating operation of the storage system of FIG. 12 according to example embodiments. FIGS. 14 and 16 are block diagrams illustrating a register provided in the storage system of FIG. 12 according to example embodiments.

Referring to FIGS. 12 and 13, a storage system 3 according to example embodiments may further include a patrol read module 214c, a register 219, and a temperature sensor 230.

The temperature sensor 230 may sense a temperature T of the nonvolatile memory 220, the patrol read module 214c may periodically perform a patrol read operation, and the retention module 214b may count the number of errors occurred in the patrol read operation (operation S210).

The temperature sensor 230 may be connected to the nonvolatile memory 220 to sense the temperature T of the nonvolatile memory 220. The temperature sensor 230 may provide the sensed temperature T to the retention module 214b.

The patrol read module 214c may be implemented in firmware or software, and may be loaded into the working memory 214. Alternatively, the patrol read module 214c may be implemented in hardware. The patrol read module 214c may perform the patrol read operation according to a set period. The set period may be, for example, a period set by a setting command provided from the host 100.

The patrol read operation may indicate that the patrol read module 214c reads the valid data from all valid pages of the nonvolatile memory 120 by itself without receiving a read command from the host 100. The patrol read module 214c may itself issue a read command and address, and according to the read command and address, may read the valid data from all valid pages of the nonvolatile memory 120. At this time, the ECC engine 217 may perform an error detection and correction function on the valid data read from the valid page by the patrol read module 214c. The retention module 214b may count the number of errors detected in the patrol read operation.

The retention module 214b may determine whether the temperature T of the nonvolatile memory 220 is greater than or equal to a set temperature Tth during a set time Pth or whether the number NOE of errors counted is greater than or equal to a set value Eth (operation S220). The set time Pth and the set value Eth may be, for example, a time and a value set by the setting command provided from the host 100.

When the temperature T of the nonvolatile memory 220 is lower than the set temperature Tth during the set time Pth and the number NOE of errors counted is less than the set value Eth, the retention module 214b may go back to operation S210.

When it is determined that the temperature T of the nonvolatile memory 220 is greater than or equal to the set temperature Tth during the set time Pth or the number NOE of errors counted is greater than or equal to the set value Eth, the retention module 214b may determine the retention level (operation S230). The retention module 214b may determine the retention level based on the temperature T of the nonvolatile memory 220 maintained for the set time Pth or the number NOE of errors counted.

Referring to FIG. 14, a plurality of tables 219a and 219b may be stored in the register 219. The plurality of tables 219a and 219b may be, for example, tables stored by the setting command provided from the host 100.

A first table 219a may indicate retention levels Lr respectively corresponding to temperatures T of the nonvolatile memory 220. A second table 219b may indicate the retention levels Lr respectively corresponding to the number NOE of errors that have occurred in the patrol read operation.

The retention module 214b may read the retention level depending on the temperature T of the nonvolatile memory 220 from the first table 219a. The retention module 214b may read the retention level based on, for example, the average temperature of the temperature T of the nonvolatile memory 220 during the set time Pth. The retention module 214b may read the retention level depending on the number NOE of errors occurred in the patrol read operation from the second table 219b to determine the retention level.

The retention module 214b may perform the retention operation based on the determined retention level (operation S240). The higher the temperature T of the nonvolatile memory 220 and the greater the number NOE of errors occurred in the patrol read operation, the more deterioration that may occur in the memory cells. Accordingly, the retention module 214b may control the width of the threshold voltage distribution corresponding to the valid data to be smaller as the temperature T of the nonvolatile memory 220 increases and the number NOE of errors occurred in the patrol read operation increases. The retention module 214b may control the width of the threshold voltage distribution corresponding to the valid data to be smaller by controlling the number of program voltages used in the retention operation, the program time, and/or the like. The retention module 214b may perform the retention operation described with reference to FIGS. 6 to 10.

For example, FIG. 7 illustrates the threshold voltage distribution of the memory cells in which the retention operation has been performed based on a first retention level L1 when the temperature T of the nonvolatile memory 220 is a first temperature T1, or the threshold voltage distribution of the memory cells in which the retention operation has been performed based on a first retention level $L1^1$ when the number NOE of errors that have occurred in the patrol read operation is a first value NOE1. In this case, FIG. 9 shows a method in which the retention module 214b programs the valid data in the free page based on the first retention levels L1 and L1'. FIG. 7 illustrates the threshold voltage distribution of the memory cells in which the retention operation has been performed based on a second retention level L2 when the temperature T of the nonvolatile memory 220 is a second temperature T2, or the threshold voltage distribution of the memory cells in which the retention operation has been performed based on a second retention level L2' when the number NOE of errors occurred in the patrol read operation is a second value NOE2. In this case, FIG. 9 shows a method in which the retention module 214b programs the valid data in the free page according to the second retention levels L2 and L2'.

Referring to FIGS. 7 and 8, the first temperature T1 may be lower than the second temperature T2, and the first value NOE1 may be less than the second value NOE2. The width W1 of the threshold voltage distribution 40 of the memory cells in which the retention operation has been performed based on the second retention levels L2 and L2' may be smaller than the width W2 of the threshold voltage distribution 30 of the memory cells in which the retention operation has been performed based on the first retention levels L1 and L1'.

In addition, referring to FIGS. 9 and 10, the retention module 214b may program the valid data into the free page using more program voltages as the temperature T of the nonvolatile memory 220 increases and/or the number NOE of errors occurred in the patrol read operation increases.

FIG. 15 is a block diagram illustrating an operation of a storage system according to example embodiments.

Referring to FIGS. 12 and 15, the storage device 200 may be powered by received power (operation S310). The storage device 200 may receive a power-off period Pp from the host 100 (operation S320). That is, while the storage device 200 is powered on, the host 100 may receive the power-off period Pp during which the storage device 200 maintains a power-off state. The retention module 214b may determine whether the power-off period Pp of the storage device 200 is greater than or equal to a set power-off period Pp_th (operation S330). When the power-off period Pp of the storage device 200 is less than the set power-off period Pp_th, the flow may return to operation S310.

When it is determined that the power-off period Pp of the storage device 200 is greater than or equal to the set power-off period Pp_th, the retention module 214b may determine the retention level (operation S340). The retention module 214b may determine the retention level based on the power-off period Pp of the storage device 200. For example, if the power-off period Pp is greater than or equal to first power-off period Ppf1, the retention level may be determined as a first retention level L1". For example, if the power-off period Pp is greater than or equal to second power-off period Ppf2, the retention level may be determined as a second retention level L2".

Referring to FIG. 16, the register 219 may further include a third table 219c. The third table 219c may be, for example, a table stored by the setting command provided from the host 100.

The third table 219c may include the retention level Lr depending on the power-off period Pp of the storage device 200. The retention module 214b may read the retention level depending on the power-off period Pp of the storage device 200 to determine the retention level.

The retention module 214b may perform the retention operation based on the determined retention level (operation S350). The longer the power-off period Pp of the storage device 200, the more deterioration that may occur in the memory cells. Accordingly, as the power-off period Pp of the storage device 200 increases, the retention module 214b may control the width of the threshold voltage distribution corresponding to the valid data to be smaller. The retention module 214b may control the width of the threshold voltage distribution corresponding to the valid data to be smaller by controlling the number of program voltages used in the retention operation, the program time, and/or the like. The retention module 214b may perform the retention operation described with reference to FIGS. 6 to 10.

For example, FIG. 8 illustrates the threshold voltage distribution of the memory cells in which the retention operation has been performed based on a first retention level L1" when the power-off period Pp of the storage device 200 is a first power-off period Ppf1. In this case, FIG. 10 shows a method in which the retention module 214b programs the valid data in the free page based on the first retention level L1". FIG. 7 illustrates the threshold voltage distribution of the memory cells in which the retention operation has been performed based on a second retention level L2" when the power-off period Pp of the storage device 200 is a second power-off period Ppf2. In this case, FIG. 9 shows a method in which the retention module 214b programs the valid data in the free page based on the second retention level L2".

Referring to FIGS. 7 and 8, the width W1 of the threshold voltage distribution 40 of the memory cells in which the retention operation has been performed based on the second retention level L2" may be smaller than the width W2 of the threshold voltage distribution 30 of the memory cells in which the retention operation has been performed based on the first retention level L1".

In addition, referring to FIGS. 9 and 10, the retention module 214b may program the valid data into the free page using more program voltages as the power-off period Pp of the storage device 200 increases.

FIG. 17 is a flowchart illustrating operation of a storage system according to still other example embodiments. For simplicity of description, the following description will focus on differences from the description with reference to FIG. 15.

Referring to FIGS. 12 and 17, the storage device 200 may be powered by received power (operation S310), and may receive a power-off period of the storage device 200 and a power-off period INF_P from the host 100 (operation S320).

The storage device 200 may calculate the power-off period Pp during which the storage device 200 maintains the power-off state by using the power-off period of the storage device 200 and the power-off period INF_P (operation S325).

The storage device 200 may compare the power-off period Pp with a set power-off period Pp_th (operation S330). If the power-off period Pp of the storage device 200 is less than the set power-off period Pp_th, the flow may return to operation S310.

When it is determined that the power-off period Pp of the storage device 200 is greater than or equal to the set power-off period Pp_th, the retention module 214b may determine the retention level (operation S340). The retention module 214b may perform the retention operation based on the determined retention level (operation S350).

When it is determined that the retention performance is deteriorated, the storage device 200 according to example embodiments may rewrite the valid data by itself to enhance or improve the retention performance.

Figure 18:
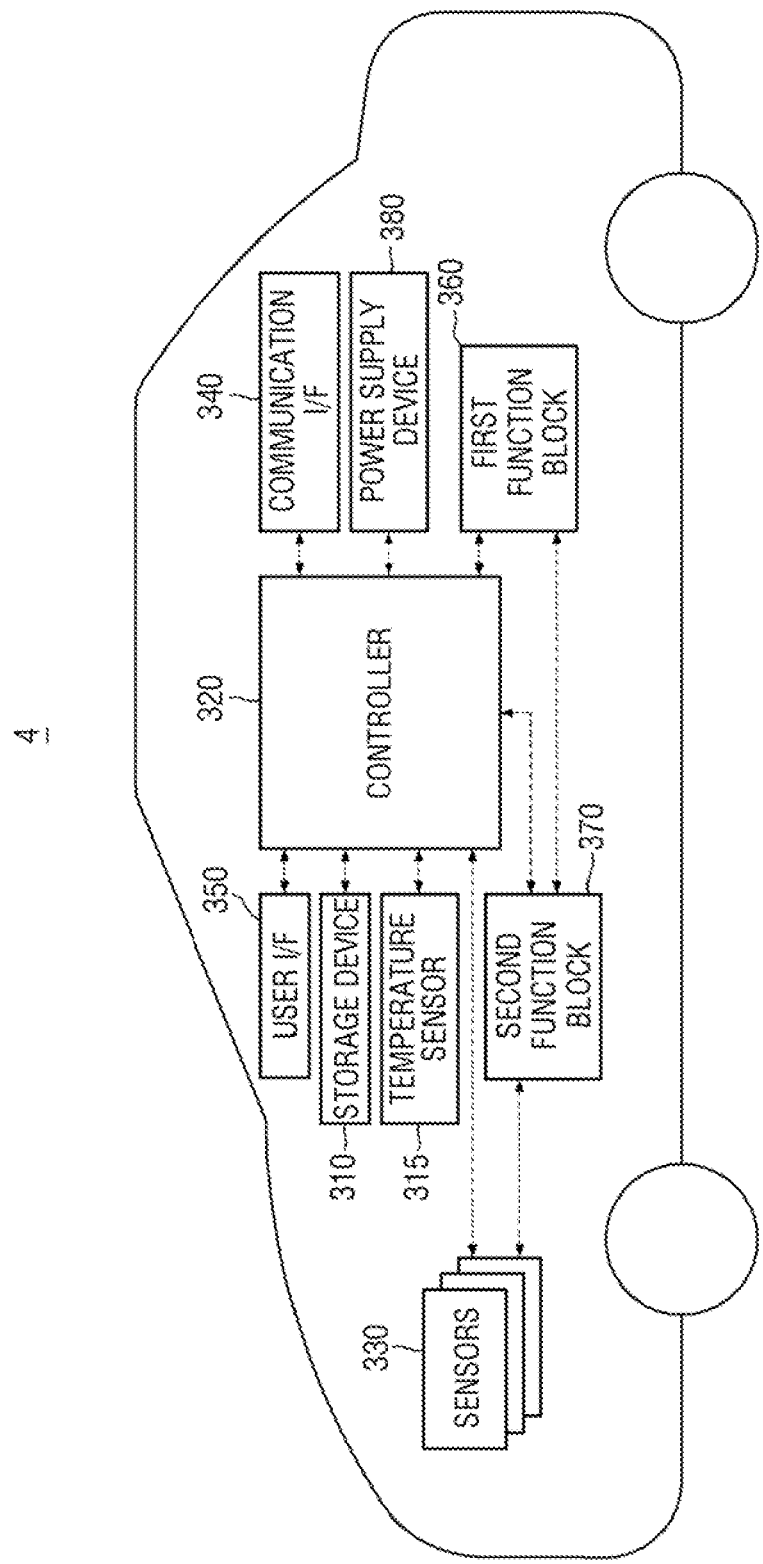
FIG. 18 is a block diagram illustrating a storage system according to example embodiments.
Figure 19:
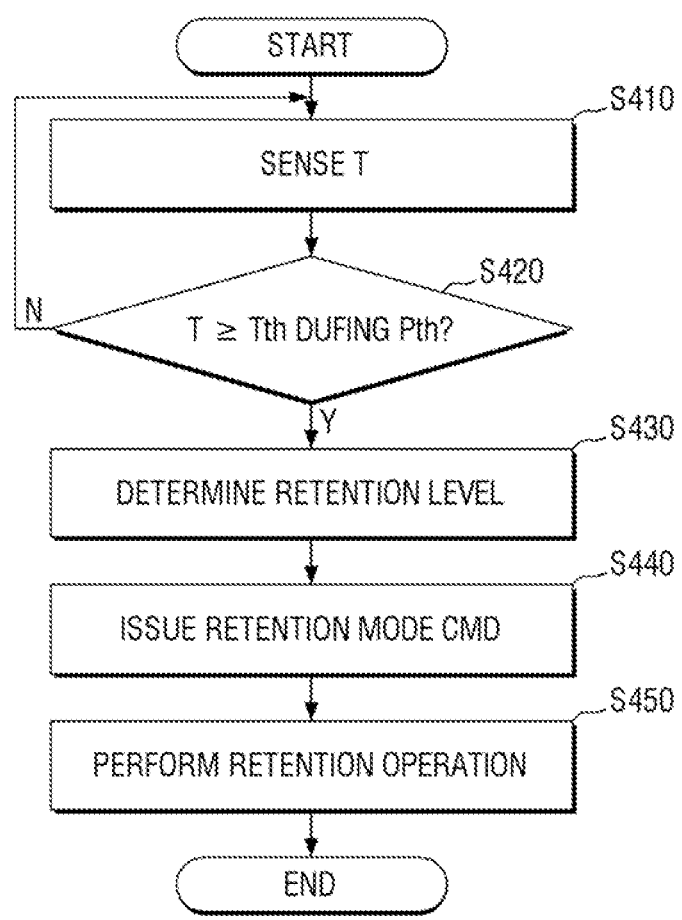
FIGS. 19 and 20 are flowcharts illustrating operation of a storage system according to example embodiments.
Figure 20:
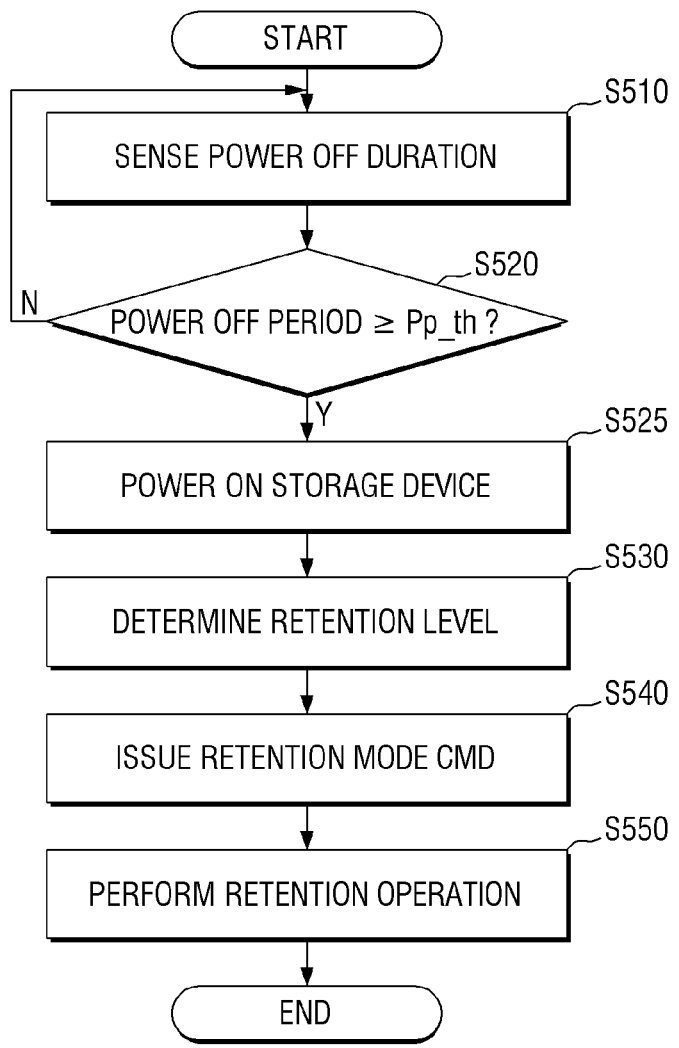

FIG. 18 is a block diagram illustrating a storage system according to example embodiments. FIGS. 19 and 20 are flowcharts illustrating the operation of FIG. 18.

Referring to FIG. 18, a storage system 4 according to example embodiments may be a vehicle. The storage system 4 may include a storage device 310, a temperature sensor 315, a controller 320, one or more sensors 330, a communication interface 340, a user interface 350, a first function block 360, a second function block 370, and a power supply device 380.

The storage device 310 may be one of the storage devices 200 described above with reference to FIGS. 1 to 17.

The temperature sensor 315 may sense the temperature of the storage device 310. The temperature of the storage device 310 sensed by the temperature sensor 315 may be provided to the controller 320.

The controller 320 may control the overall operation of the storage system 4. The controller 320 may control the power supply device 380 to supply power to the storage device 310, the temperature sensor 315, the controller 320, the one or more sensors 330, the communication interface 340, the user interface 350, the first function block 360, the second function block 370, and the power supply device 380. The controller 320 may provide a retention mode command to the storage device 310 based on the temperature of the storage device 310 sensed by the temperature sensor 315 or a power-off period during which the storage device 310 maintains a power-off state.

The sensor 330 may include one or more camera devices, one or more LiDAR sensors, one or more active scanning devices such as ultrasonic sensors, and one or more geospatial positioning devices, and the like. The sensor 1150 may generate a sensing signal by monitoring at least a part of an external environment surrounding the vehicle.

The communication interface 340 may include a wireless transceiver and/or a global positioning system (GPS).

The user interface 350 may include a display unit indicating a dashboard of a vehicle. The display unit may display the application 122 described above with reference to FIGS. 1 to 11. As described with reference to FIGS. 1 to 11, the user may provide a retention mode activation request including a retention level through the displayed application 122 so that the storage device 310 performs a retention operation. Accordingly, the controller 320 may provide the retention mode command including the retention level to the storage device 310.

The first function block 360 may perform a first process. The second function block 370 may perform a second process. The first process and the second process may be different from each other. The first and second processes may refer to, for example, operations of a vehicle steering device configured to control the direction of the vehicle, a throttle device configured to control acceleration and/or deceleration by controlling a motor or engine of the vehicle, a brake device configured to control the braking of the vehicle, an external lighting device, and the like.

Referring to FIGS. 18 and 19, the temperature sensor 315 may sense a temperature T of the storage device 310 (operation S410). The controller 320 may determine whether the temperature T of the storage device 310 is higher than or equal to the set temperature Tth during the set time Pth (operation S420). When the temperature T of the storage device 310 is less than the set temperature Tth during the set time Pth, the flow may return to operation S410.

When it is determined that the temperature T of the storage device 310 is higher than or equal to the set temperature Tth during the set time Pth, the controller 320 may determine the retention level (operation S430). The controller 320 may include a register in which the retention level depending on the temperature T of the storage device 310 has been stored. The controller 320 may read the retention level depending on the temperature T of the storage device 200 from the register to determine the retention level. The controller 320 may issue the retention mode command including the retention level (operation S440). The storage device 310 may receive the retention mode command and perform the retention operation (operation S450). Example embodiments are not limited thereto, and the controller 320 may issue the retention mode command by receiving the temperature T of the storage device 310 from the temperature sensor in the storage device 310.

Referring to FIGS. 18 and 20, the controller 320 may sense the power-off period Pp during which the storage device 310 maintains the power-off state (operation S510). If the power-off period Pp of the storage device 310 is less than the set power-off period Pp_th, the flow may return to operation S510.

When it is determined that the power-off period Pp of the storage device 310 is greater than or equal to the set power-off period Pp_th, the controller 320 may power on the storage device 310 (operation S525). The controller 320 may control the power supply device 380 to supply power to the storage device 310. The controller 320 may determine the retention level based on the power-off period Pp (operation S530). The controller 320 may include a register in which the retention level depending on the power-off period Pp of the storage device 310 has been stored. The controller 320 may read the retention level depending on the power-off period Pp of the storage device 310 from the register to determine the retention level. The controller 320 may issue the retention mode command including the retention level (operation S540). The storage device 310 may receive the retention mode command and perform the retention operation (operation S550).

When the vehicle is parked for a long time, the storage device 310 may be in a power-off state for a long time. Accordingly, deterioration of the retention performance of the storage device 310 may occur. In addition, the temperature of the storage device 310 may increase due to the environment of the vehicle, and accordingly, the retention performance of the storage device 310 may be deteriorated.

However, in the storage system according to example embodiments, the retention operation may be performed based on the temperature of the storage device 310 and/or the power-off period of the storage device 310. In addition, the retention operation may be performed at the request of the user. Accordingly, the retention performance of the storage device 310 may be improved or enhanced.

Figure 21:
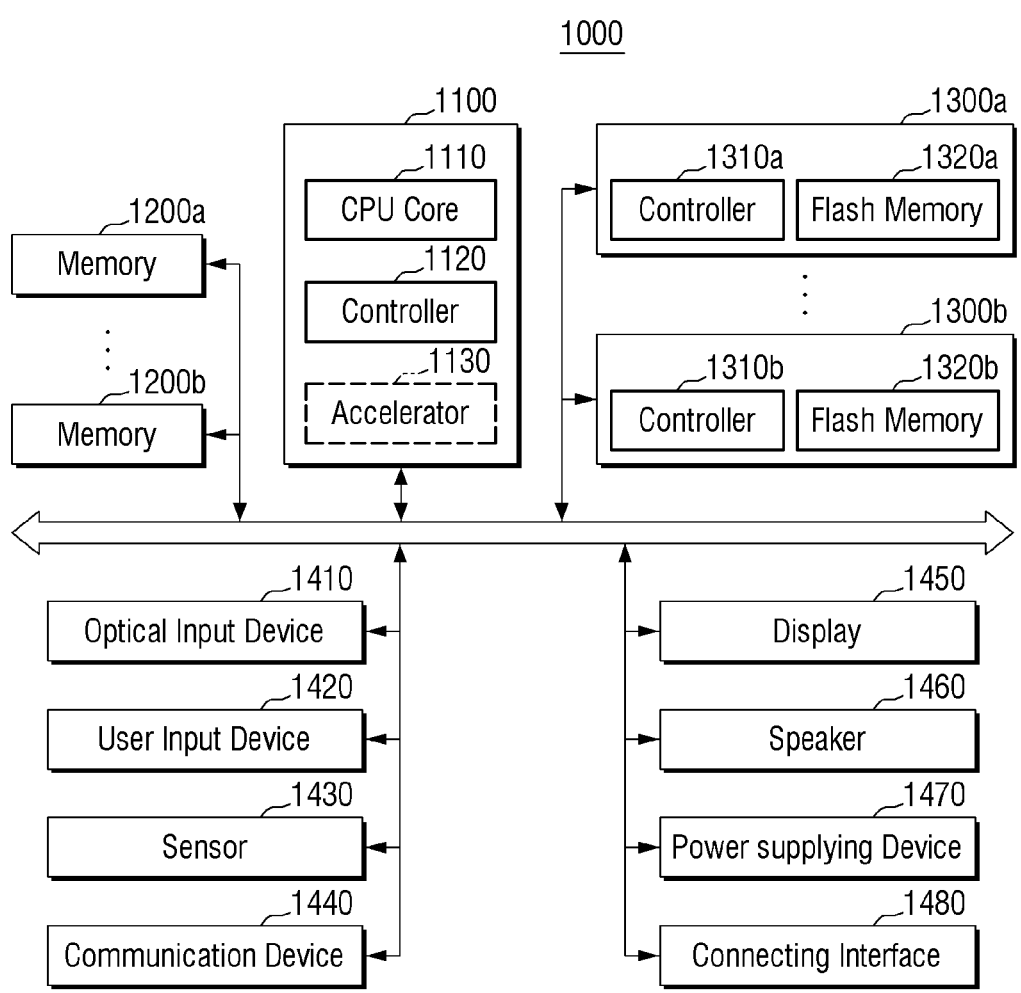
FIG. 21 is a diagram illustrating a system to which a storage system according to example embodiments is applied.

FIG. 21 is a diagram illustrating a system to which a storage system according to example embodiments is applied.

A system 1000 of FIG. 21 may be a mobile system such as a portable communication terminal (mobile phone), a smart phone, a tablet personal computer, a wearable device, a healthcare device, or an Internet of Things (IoT) device. However, example embodiments are not necessarily limited to a mobile system, and the system 1000 of FIG. 21 may also be a personal computer, a laptop computer, a server, a media player, an automotive device such as a navigation system, or the like.

Referring to FIG. 21, the system 1000 may include a main processor 1100, memories 1200a and 1200b, and storage devices 1300a and 1300b, and additionally, may include one or more of an image capturing device 1410, a user input device 1420, a sensor 1430, a communication device 1440, a display 1450, a speaker 1460, a power supply device 1470, and a connection interface 1480.

The main processor 1100 may control the overall operation of the system 1000, more specifically, the operations of other components constituting the system 1000. The main processor 1100 may be implemented as a general-purpose processor, a dedicated processor, an application processor, or the like.

The main processor 1100 may include one or more CPU cores 1110, and may further include a controller 1120 for controlling the memories 1200a and 1200b and/or the storage devices 1300a and 1300b. According to an example embodiment, the main processor 1100 may further include an accelerator block 1130, which is a dedicated circuit for high-speed data operation such as artificial intelligence (AI) data operation. The accelerator block 1130 may include a graphics processing unit (GPU), a neural processing unit (NPU), a data processing unit (DPU), and/or the like, and may be implemented as a separate chip physically independent of other components of the main processor 1100.

The memories 1200a and 1200b may be used as main memory devices of the system 1000, and may include a volatile memory such as SRAM and/or DRAM, or may include a nonvolatile memory such as a flash memory, PRAM and/or RRAM. The memories 1200a and 1200b may be implemented in the same package as the main processor 1100.

The storage devices 1300a and 1300b may be the storage device 200 described above with reference to FIGS. 1 to 17.

The storage devices 1300a and 1300b may function as nonvolatile storage devices that store data regardless of whether power is supplied or not, and may have a relatively larger storage capacity than the memories 1200a and 1200b. The storage devices 1300a and 1300b may be the storage device 200 described with reference to FIGS. 1 to 17.

The image capturing device 1410 may capture a still image or a moving picture (e.g., a series of still images), and may be a camera, a camcorder, a webcam, and/or the like.

The user input device 1420 may receive various types of data inputted from a user of the system 1000, and may be a touch pad, a keypad, a keyboard, a mouse, a microphone, and/or the like.

The sensor 1430 may sense various types of physical quantities that can be obtained from the outside of the system 1000 and may convert the sensed physical quantities into electric signals. The sensor 1430 may be a temperature sensor, a pressure sensor, an illuminance sensor, a position sensor, an acceleration sensor, a biosensor, a gyroscope, and/or the like.

The communication device 1440 may transmit and receive signals to and from other devices outside the system 1000 according to various communication protocols. The communication device 1440 may be implemented by including an antenna, a transceiver, a modem (MODEM), and/or the like.

The display 1450 and the speaker 1460 may function as output devices that output visual information and auditory information to the user of the system 1000, respectively.

The power supply device 1470 may appropriately convert power supplied from a battery built in the system 1000 and/or an external power source to supply the power to each component of the system 1000.

The connection interface 1480 may provide a connection between the system 1000 and an external device connected to the system 1000 and capable of exchanging data with the system 1000.

Figure 22:
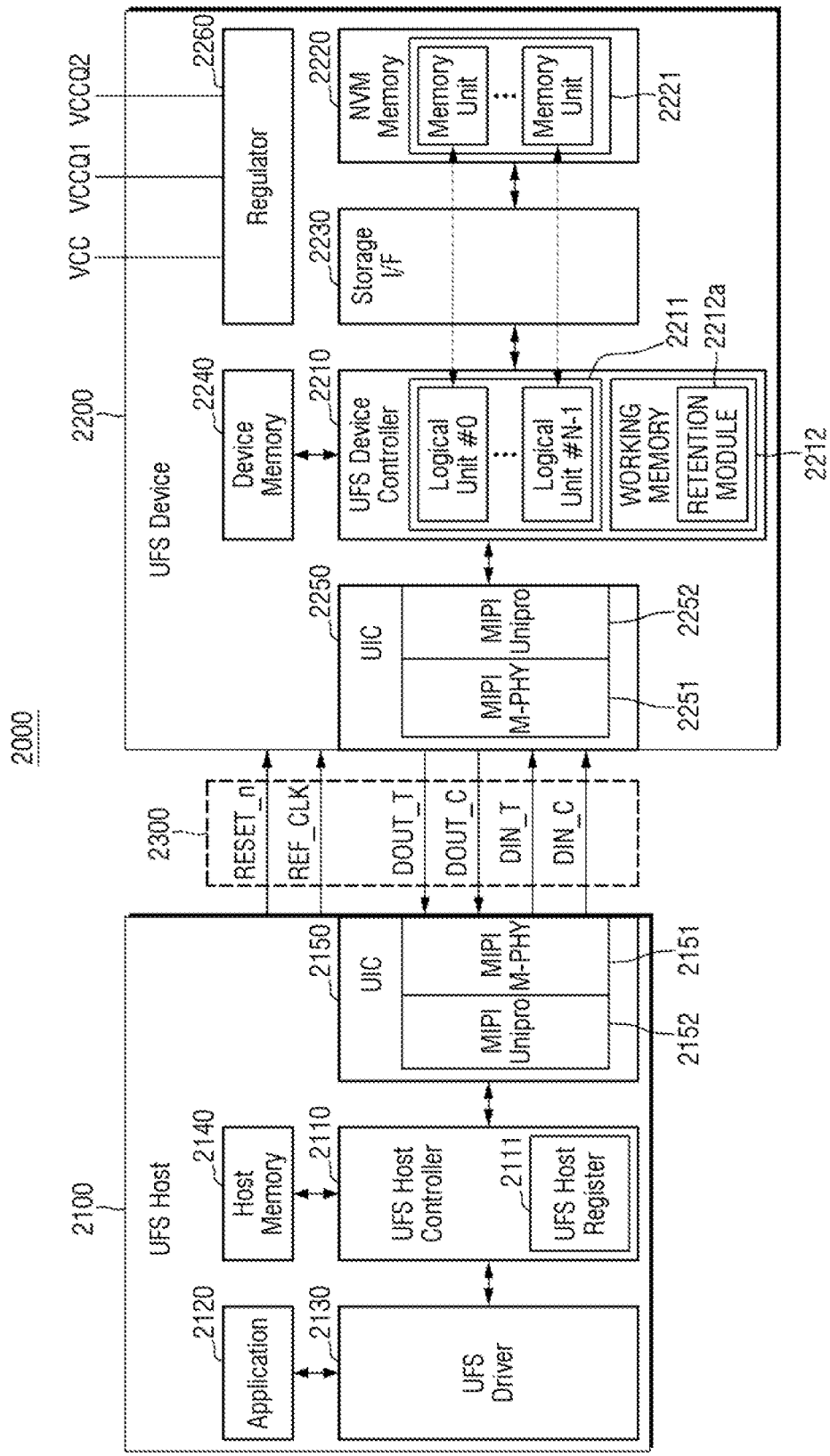
FIG. 22 is a diagram illustrating a UFS system according to example embodiments.

FIG. 22 is a diagram illustrating a UFS system according to example embodiments. A UFS system 2000 is a system conforming to the UFS standard announced by the Joint Electron Device Engineering Council (JEDEC), and may include a UFS host 2100, a UFS device 2200, and a UFS interface 2300. The above description of the system 1000 of FIG. 21 may also be applied to the UFS system 2000 of FIG. 22 within a range that does not conflict with the following description of FIG. 22.

Referring to FIG. 22, the UFS host 2100 and the UFS device 2200 may be interconnected through the UFS interface 2300. When the main processor 1100 of FIG. 21 is an application processor, the UFS host 2100 may be implemented as part of the corresponding application processor. A UFS host controller 2110 and a host memory 2140 may correspond to the controller 1120 and the memories 1200a and 1200b of the main processor 1100 of FIG. 21, respectively. The UFS device 2200 may correspond to the storage devices 1300a and 1300b of FIG. 21, and a UFS device controller 2210 and a nonvolatile memory 2220 may correspond to the storage controllers 1310a and 1310b and the nonvolatile memories 1320a and 1320b of FIG. 21, respectively.

The UFS host 2100 may include the UFS host controller 2110, an application 2120, a UFS driver 2130, the host memory 2140, and a UFS interconnect (UIC) layer 2150. The UFS device 2200 may include a UFS device controller 2210, the nonvolatile memory 2220, a storage interface 2230, a device memory 2240, a UIC layer 2250, and a regulator 2260. The nonvolatile memory 2220 may be composed of a plurality of memory units 2221, and the memory unit 2221 may be the nonvolatile memory 220 described with reference to FIGS. 2 and 3. The UFS device controller 2210 and the nonvolatile memory 2220 may be connected to each other through the storage interface 2230.

The application 2120 may refer to a program that desires communication with the UFS device 2200 in order to use the functions of the UFS device 2200. The application 2120 may transmit an input-output request (IOR) to the UFS driver 2130 for input/output to the UFS device 2200.

The UFS driver 2130 may manage the UFS host controller 2110 through a UFS-HCI (host controller interface). The UFS driver 2130 may convert the input/output request generated by the application 2120 into a UFS command defined by the UFS standard, and transmit the converted UFS command to the UFS host controller 2110. One input/output request may be converted into a plurality of UFS commands. The UFS command may be a command defined by the SCSI standard, but may also be a UFS standard-only command.

The UFS host controller 2110 may transmit the UFS command converted by the UFS driver 2130 to the UIC layer 2250 of the UFS device 2200 through the UIC layer 2150 and the UFS interface 2300. In this process, a UFS host register 2111 of the UFS host controller 2110 may serve as a command queue (CQ).

The UIC layer 2150 of the UFS host 2100 may include a MIPI M-PHY 2151 and a MIPI UniPro 2152, and the UIC layer 2250 of the UFS device 2200 may include a MIPI M-PHY 2251 and a MIPI UniPro 2252.

The UFS interface 2300 may include a line that transmits a reference clock REF_CLK, a line that transmits a hardware reset signal RESET_n for the UFS device 2200, a pair of lines that transmit a differential input signal pair DIN_t and DIN c, and a pair of lines that transmit a differential output signal pair DOUT t and DOUT_c.

The UFS device controller 2210 of the UFS device 2200 may control the overall operation of the UFS device 2200. The UFS device controller 2210 may manage the nonvolatile memory 2220 through a logical unit (LU) 2211 that is a logical data storage unit. The number of the LUs 2211 may be eight, but is not limited thereto.

The UFS device controller 2210 may include a working memory 2212 in which a retention module 2212a is driven. The retention module 2212a and the nonvolatile memory 2220 may be the retention module 214a and the nonvolatile memory 220 described above with reference to FIGS. 1 to 17.

The UFS host 2100 may sequentially store commands to be transmitted to the UFS device 2200 in the UFS host register 2111 which may function as a command queue, and transmit the commands to the UFS device 2200 in the above order. At this time, even when a previously transmitted command is still being processed by the UFS device 2200, that is, even before receiving a notification that the previously transmitted command has been processed by the UFS device 2200, the UFS host 2100 may transmit a next command waiting in a command queue to the UFS device 2200. Accordingly, the UFS device 2200 may receive the next command from the UFS host 2100 even while processing the previously transmitted command. The plurality of memory units 2221 may be the nonvolatile memory 220 described above with reference to FIGS. 2 and 3.

Figure 23:
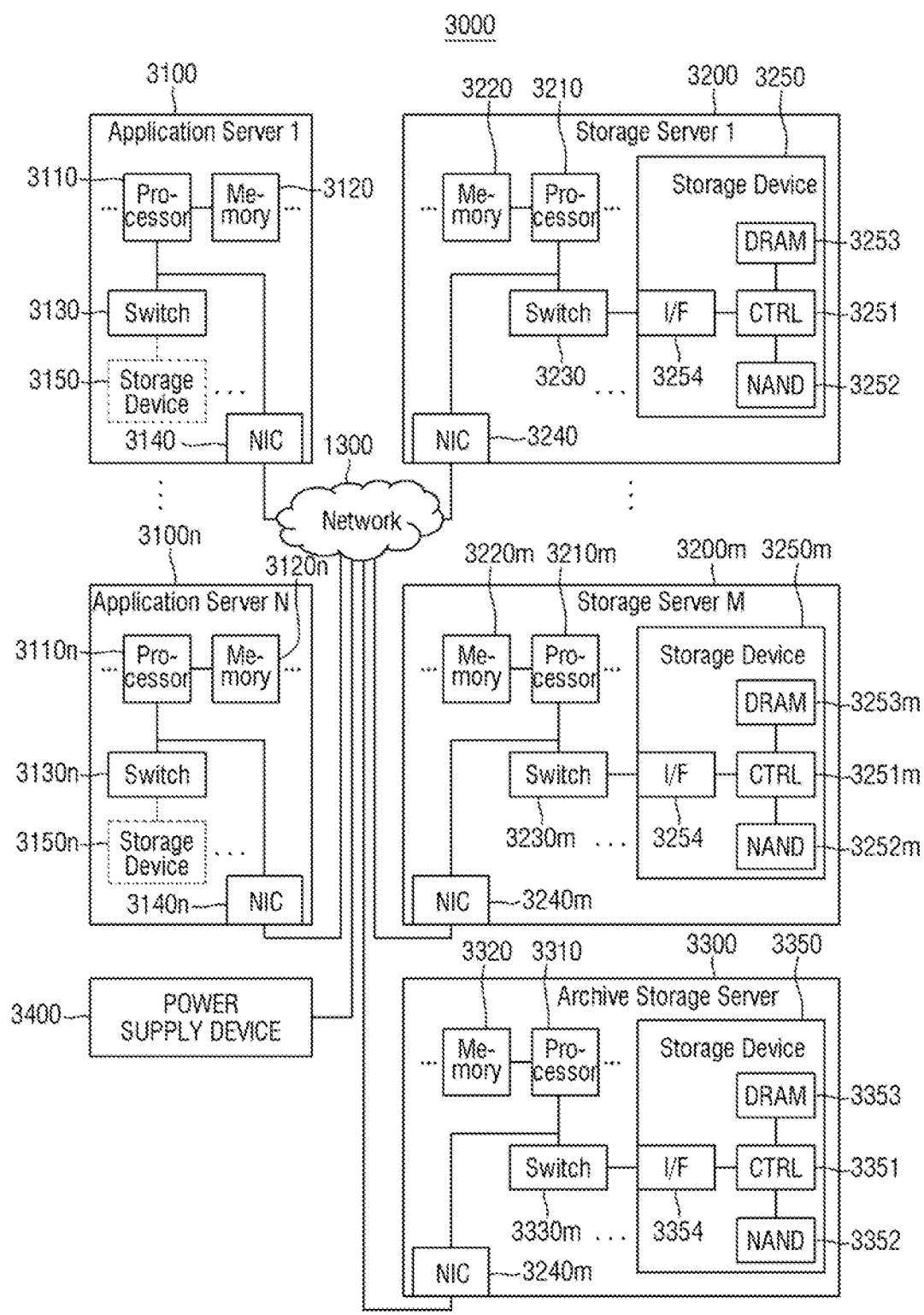
FIG. 23 is a diagram illustrating a data center to which a storage system according to example embodiments is applied.

FIG. 23 is a diagram illustrating a data center to which a storage system according to example embodiments is applied.

Referring to FIG. 23, a data center 3000 is a facility that collects various types of data and provides services, and may be referred to as a data storage center. The data center 3000 may be a system for operating a search engine and a database, or may be a computing system used in a government institution or a company such as a bank. The data center 3000 may include application servers 3100 to 3100n, storage servers 3200 to 3200m, and an archive storage server 3300. The number of the application servers 3100 to 3100n, the number of the storage servers 3200 to 3200m, and the archive storage server 3300 may be variously selected according to example embodiments, and the number of the application servers 3100 to 3100n, the number of the storage servers 3200 to 3200m, and the number of the archive storage server 3300 may be different from each other.

The application server 3100, the storage server 3200, and the archive storage server 3300 may include at least one of a processor 3110, 3210, 3310 or a memory 3120, 3220, 3320. When describing the storage server 3200 as an example, the processor 3210 may control the overall operation of the storage server 3200, and access the memory 3220 to execute instructions and/or data loaded in the memory 3220. The memory 3220 may be a double data rate synchronous DRAM (DDR SDRAM), a high bandwidth memory (HBM), a hybrid memory cube (HMC), a dual in-line memory module (DIMM), an Optane DIMM, or a nonvolatile DIMM (NVMDIMM). According to an example embodiment, the number of the processors 3210 and the number of the memories 3220 included in the storage server 3200 may be variously selected. In an example embodiment, the processor 3210 and the memory 3220 may be provided as a processor-memory pair. In an example embodiment, the number of processors 3210 and the number of memories 3220 may be different. The processor 3210 may include a single core processor or a multiple core processor. The above description of the storage server 3200 may be similarly applied to the application server 3100. According to an example embodiment, the application server 3100 may not include the storage device 3150. The storage server 3200 may include at least one storage device 3250. The number of storage devices 3250 included in the storage server 3200 may be variously selected according to example embodiments. A controller 3251, 3351, a NAND 3252, 3352, a DRAM 3253, 3353, and an interface 3254, 3354 may be the storage controller 210, the nonvolatile memory 220, the buffer memory 216, and the device interface 211 described above with reference to FIGS. 1 to 17, respectively.

The application servers 3100 to 3100n, the storage servers 3200 to 3200m, and the archive storage server 3300 may communicate with each other through a network 1300. The network 1300 may be implemented using a Fibre Channel (FC), Ethernet, or the like. In this case, the FC may be a medium used for relatively high-speed data transmission, and an optical switch providing high performance/high availability may be used. The storage servers 3200 to 3200m may be provided as file storage, block storage, or object storage according to an access method of the network 1300.

In an example embodiment, the network 1300 may be a storage-only network, such as a storage area network (SAN). As one example, the SAN may an FC-SAN that uses an FC network and is implemented according to FC Protocol (FCP). As another example, the SAN may be an IP-SAN that uses a TCP/IP network and is implemented according to an iSCSI (SCSI over TCP/IP or Internet SCSI) protocol. In another example embodiment, the network 1300 may be a general network such as the TCP/IP network. For example, the network 1300 may be implemented according to a protocol such as FC over Ethernet (FCoE), network attached storage (NAS), NVMe over Fabrics (NVMe-oF), or the like.

Hereinafter, a description will be given focusing on the application server 3100 and the storage server 3200. The description of the application server 3100 may also be applied to another application server 3100n, and the description of the storage server 3200 may also be applied to another storage server 3200m.

The application server 3100 may store data requested to be stored by a user or a client in one of the storage servers 3200 to 3200m through the network 1300. In addition, the application server 3100 may acquire data requested to be read by a user or a client from one of the storage servers 3200 to 3200m through the network 1300. For example, the application server 3100 may be implemented as a web server, a database management system (DBMS), or the like.

The application server 3100 may access a memory 3120n or a storage device 3150n included in another application server 3100n through the network 1300, or may access the memories 3220 to 3220m or the storage devices 3250 to 3250m included in the storage servers 3200 to 3200m through the network 1300. Accordingly, the application server 3100 may perform various operations on data stored in the application servers 3100 to 3100n and/or the storage servers 3200 to 3200m. For example, the application server 3100 may execute a command for moving or copying data between the application servers 3100 to 3100n and/or the storage servers 3200 to 3200m. At this time, the data may be transferred from the storage devices 3250 to 3250m of the storage servers 3200 to 3200m to the memories 3120 to 3120n of the application servers 3100-3100n directly or through the memories 3220 to 3220m of the storage servers 3200 to 3200m. Data moving through the network 1300 may be encrypted data for security or privacy.

The archive storage server 3300 may be used as a secondary storage server for cold storage. Therefore, an access frequency may be lower and a power-off period may be longer, compared to the storage servers 3200 to 3200m.

Switches 3230 and 3330 may selectively connect the processor 3210, 3310 to the storage device 3250, 3350, or may selectively connect the NIC 3240, 3340 to the storage device 3250, 3350, under the control of the processor 3210, 3310.

A power supply device 3400 may supply power to the application servers 3100 to 3100n, the storage servers 3200 to 3200m, and the archive storage server 3300.

The data center 3000 may further include the archive storage server 3300 and the power supply device 3400. The archive storage server 3300 may be used as a secondary storage server for cold storage. In addition, the archive storage server 3300 may store therein data requiring permanent or long-term storage, such as original data.

In the data center 3000 according to example embodiments, the archive storage server 3300 may perform the retention operation as described above with reference to FIGS. 1 to 17. Accordingly, the retention performance of the archive storage server 3300 may be enhanced or improved.

At least one of the components, elements, modules or units (collectively "components" in this paragraph) represented by a block in the drawings may be embodied as various numbers of hardware, software and/or firmware structures that execute respective functions described above, according to an example embodiment. These components may include, for example, the FTL 214a, the retention module 214b, the patrol read module 214c, the packet manager 215, the ECC 217, the AES 218, the controller 222, the controller 320, the first function block 360, and the second function block 370 shown in FIGS. 2, 12 and 18, not being limited thereto. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components.

It will be also understood that, although in example embodiments related to methods or flowcharts, a step or operation is described later than another step or operation, the step or operation may be performed earlier than the other step or operation unless the other step or operation is described as being performed after the step or operation.

While example embodiments have been described with reference to the accompanying drawings, it will be apparent to those skilled in the art that modifications and variations could be made without departing from the scope of the present disclosure.

What is claimed is:

1. A storage device comprising:
    a nonvolatile memory comprising a valid page and a free page;
    a temperature sensor configured to sense a temperature of the nonvolatile memory; and
    a storage controller comprising at least one processor configured to control:
        a patrol read module to read valid data stored in the valid page and identify a number of errors in the read valid data according to a set time period; and
        a retention module to, based on the temperature or the number of errors, read the valid data stored in the valid page, and write the valid data to the free page while controlling a threshold voltage distribution width corresponding to a value of the valid data written to the free page,
    wherein the storage device is further configured to receive a power-off period corresponding to the storage device, and
    wherein the at least one processor is further configured to control the retention module to, further based on the power-off period, read the valid data stored in the valid page, and write the read valid data to the free page while controlling the threshold voltage distribution width corresponding to the value of the valid data written to the free page.

2. The storage device of claim 1, wherein the storage controller comprises a buffer memory, and
    wherein the at least one processor is further configured to control the retention module to store the valid data read from the valid page in the buffer memory, and write the valid data stored in the buffer memory to the free page.

3. The storage device of claim 2, wherein the nonvolatile memory comprises a first memory block and a second memory block separate from the first memory block, and
    wherein the valid page is provided in the first memory block and the free page is provided in the second memory block.

4. The storage device of claim 1, wherein the at least one processor is further configured to control the retention module to read the valid data stored in the valid page and write the valid data to the free page based on the power-off period being greater than or equal to a set power-off period.

5. The storage device of claim 1, wherein the at least one processor is further configured to control the retention module to read the valid data stored in the valid page, and write the read valid data to the free page while controlling the threshold voltage distribution width corresponding to the value of the valid data written to the free page based on the temperature being higher than or equal to a set temperature for a set time, or the number of errors being greater than or equal to a set value.

6. The storage device of claim 1, wherein the at least one processor is further configured to control the retention module to:
    based on the temperature being higher than or equal to a first temperature and lower than or equal to a second temperature for a set time, write the read valid data to the free page while controlling the threshold voltage distribution width corresponding to the value of the valid data written to the free page to a first width,
    based on the number of errors counted being a first value, write the read valid data to the free page while controlling the threshold voltage distribution width corresponding to the value of the valid data written to the free page to the first width,
    based on the temperature being higher than the second temperature for the set time, write the read valid data to the free page while controlling the threshold voltage distribution width corresponding to the value of the valid data written to the free page to a second width, and
    based on the number of errors being a second value, write the read valid data to the free page while controlling the threshold voltage distribution width corresponding to the value of the valid data written to the free page to the second width,
    wherein the first value is smaller than the second value, and
    wherein the first width is greater than the second width.

7. The storage device of claim 1, wherein the at least one processor is further configured to control the retention module to control the threshold voltage distribution width by writing the read valid data to the free page using a program voltage whose voltage level is changed in a stepwise manner.

8. The storage device of claim 7, wherein the at least one processor is further configured to control the retention module to:
    based on the temperature being higher than or equal to a first temperature and lower than or equal to a second temperature for a set time, write the read valid data to the free page using a first program voltage whose voltage level is changed in a stepwise manner to control the threshold voltage distribution width corresponding to the value of the valid data written to the free page to a first width,
    based on the number of errors being a first value, write the read valid data to the free page using the first program voltage whose voltage level is changed in a stepwise manner to control the threshold voltage distribution width corresponding to the value of the valid data written to the free page to the first width,
    based on the temperature being higher than the second temperature for the set time, write the read valid data to the free page using a second program voltage whose voltage level is changed in a stepwise manner to control the threshold voltage distribution width corresponding to the value of the valid data written to the free page to a second width, and based on the number of errors being a second value, write the read valid data to the free page using the second program voltage whose voltage level is changed in a stepwise manner to control the threshold voltage distribution width corresponding to the value of the valid data written to the free page to the second width, wherein the first value is smaller than the second value, and wherein the first program voltage comprises a smaller number of steps than the second program voltage.

9. The storage device of claim 7, wherein the at least one processor is further configured to control the retention module to:

based on the temperature being a first temperature, write the read valid data to the free page using a first program voltage whose voltage level is changed by a first voltage level in a stepwise manner to control the threshold voltage distribution width corresponding to the value of the valid data written to the free page to a first width, based on the number of errors being a first value, write the read valid data to the free page using the first program voltage whose voltage level is changed by the first voltage level in a stepwise manner to control the threshold voltage distribution width corresponding to the value of the valid data written to the free page to the first width, based on the temperature being a second temperature, write the read valid data to the free page using a second program voltage whose voltage level is changed by a second voltage level in a stepwise manner to control the threshold voltage distribution width corresponding to the value of the valid data written to the free page to a second width, and based on the number of errors being a second value, write the read valid data to the free page using the second program voltage whose voltage level is changed by the second voltage level in a stepwise manner to control the threshold voltage distribution width corresponding to the value of the valid data written to the free page to the second width, wherein the first temperature is lower than the second temperature, wherein the first value is smaller than the second value, and wherein the first voltage level is greater than the second voltage level.

10. A storage system comprising:

a host controller configured to receive a retention level and a retention mode activation command, and generate a retention mode command indicating the retention level in response to the retention mode activation command; and a storage controller comprising at least one processor, and a nonvolatile memory device comprising a valid page and a free page, wherein the at least one processor is configured to control a retention module to, in response to the retention mode command, read valid data stored in the valid page, and write the valid data to the free page according to the retention level while controlling a threshold voltage distribution width corresponding to a value of the valid data written to the free page.

11. The storage system of claim 10, wherein the at least one processor is further configured to control the retention module to write the read valid data to the free page according to the retention level using a program voltage whose voltage level is changed in a stepwise manner to control the threshold voltage distribution width corresponding to the value of the valid data written to the free page.

12. The storage system of claim 10, wherein the storage controller further comprises a buffer memory, and wherein the at least one processor is further configured to control the retention module to store the valid data read from the valid page in the buffer memory, and write the valid data stored in the buffer memory to the free page.

13. The storage system of claim 10, wherein the threshold voltage distribution width corresponding to the value of the valid data stored in the valid page is wider than the threshold voltage distribution width corresponding to the value of the valid data written to the free page.

14. A storage system comprising:

a storage device;

a controller configured to monitor a power-off period during which the storage device maintains a power-off state, and provide a retention mode command to the storage device based on the power-off period being greater than or equal to a set power-off period; and a power supply device configured to supply power to the storage device and the controller, wherein the storage device comprises:

a nonvolatile memory comprising a valid page and a free page; and a storage controller configured to, in response to the retention mode command, read valid data stored in the valid page, and write the valid data to the free page.

15. The storage system of claim 14, wherein the controller is further configured to, based on the power-off period being greater than or equal to the set power-off period, control the power supply device to supply power to the storage device, and provide the retention mode command to the storage device.

16. The storage system of claim 14, wherein the controller is further configured to identify a retention level based on the power-off period, the retention mode command indicating the retention level, and wherein the storage controller is further configured to write the valid data to the free page according to the retention level while controlling a threshold voltage distribution width corresponding to a value of the valid data written to the free page.

17. The storage system of claim 16, wherein the retention level indicates a first retention level or a second retention level, wherein the retention mode command indicates a first retention mode command indicating the first retention level or a second retention mode command indicating the second retention level, wherein the controller is further configured to provide the first retention mode command based on the power-off period being a first set power-off period, wherein the controller is further configured to provide the second retention mode command based on the power-off period being a second set power-off period, wherein the storage controller is further configured to write the valid data to the free page according to the first retention level to control the threshold voltage distribution width corresponding to the value of the valid data written to the free page to a first width, wherein the storage controller is further configured to write the valid data to the free page according to the second retention level to control the threshold voltage distribution width corresponding to the value of the valid data written to the free page to a second width, wherein the first set power-off period is shorter than the second set power-off period, and wherein the first width is greater than the second width.

18. The storage system of claim 14, further comprising a temperature sensor configured to sense a temperature of the storage device, wherein the controller is further configured to provide the retention mode command to the storage device based on the temperature being higher than or equal to a set temperature for a set time.

19. The storage system of claim 18, wherein the controller is further configured to identify a retention level based on the temperature, and provide the retention mode command indicating the retention level to the storage device, and wherein the storage controller is further configured to write the valid page to the free page according to the retention level to control a threshold voltage distribution width corresponding to a value of the valid data written to the free page.

* * * * *